(12) United States Patent
Choi et al.

(10) Patent No.: US 10,886,452 B2
(45) Date of Patent: Jan. 5, 2021

(54) SELECTIVE AND DIRECT DEPOSITION TECHNIQUE FOR STREAMLINED CMOS PROCESSING

(71) Applicant: UNITED STATES OF AMERICA AS REPRESENTED BY THE ADMINISTRATOR OF NASA, Washington, DC (US)

(72) Inventors: Sang H. Choi, Poquoson, VA (US); Adam J. Duzik, Yorktown, VA (US)

(73) Assignee: UNITED STATES OF AMERICA AS REPRESENTED BY THE ADMINISTRATOR OF NASA, Washington, DC (US)

(*) Notice: Subject to any disclaimer, the term of this patent is extended or adjusted under 35 U.S.C. 154(b) by 0 days.

(21) Appl. No.: 16/229,838

(22) Filed: Dec. 21, 2018

(65) Prior Publication Data

US 2019/0229251 A1    Jul. 25, 2019

Related U.S. Application Data

(60) Provisional application No. 62/621,930, filed on Jan. 25, 2018.

(51) Int. Cl.
*H01L 35/34* (2006.01)
*H01L 35/30* (2006.01)
(Continued)

(52) U.S. Cl.
CPC ........... *H01L 35/34* (2013.01); *C23C 14/042* (2013.01); *C23C 14/14* (2013.01); *H01L 27/16* (2013.01);
(Continued)

(58) Field of Classification Search
CPC ....... H01L 35/34; H01L 35/30; H01L 35/325; H01L 35/20; H01L 27/16; C23C 14/14; C23C 14/042
See application file for complete search history.

(56) References Cited

U.S. PATENT DOCUMENTS

| 4,497,973 A | 2/1985 | Heath et al. |
| 5,898,259 A * | 4/1999 | Reyal ................ H01J 29/073 313/407 |

(Continued)

OTHER PUBLICATIONS

Narducci, D., "Do we really need high thermoelectric figures of merit? A critical appraisal to the power conversion efficiency of thermoelectric materials," Appl. Phys. Lett., 2011, pp. 17-20, 99(10).
(Continued)

*Primary Examiner* — Golam Mowla
(74) *Attorney, Agent, or Firm* — Shawn P. Gorman; Jennifer L. Riley; Helen M. Gaius

(57) ABSTRACT

Systems, methods, and devices of the various embodiments provide for microfabrication of devices, such as semiconductors, thermoelectric devices, etc. Various embodiments may include a method for fabricating a device, such as a semiconductor (e.g., a silicon (Si)-based complementary metal-oxide-semiconductor (CMOS), etc.), thermoelectric device, etc., using a mask. In some embodiments, the mask may be configured to allow molecules in a deposition plume to pass through one or more holes in the mask. In some embodiments, molecules in a deposition plume may pass around the mask. Various embodiments may provide thermoelectric devices having metallic junctions. Various embodiments may provide thermoelectric devices having metallic junctions rather than junctions formed from semiconductors.

19 Claims, 19 Drawing Sheets

(51) Int. Cl.
  H01L 35/32    (2006.01)
  C23C 14/14    (2006.01)
  H01L 27/16    (2006.01)
  C23C 14/04    (2006.01)
  H01L 35/20    (2006.01)
(52) U.S. Cl.
  CPC .............. *H01L 35/20* (2013.01); *H01L 35/30* (2013.01); *H01L 35/325* (2013.01)

(56) References Cited

U.S. PATENT DOCUMENTS

| | | |
|---|---|---|
| 9,142,779 B2* | 9/2015 | Chan .................. H01L 51/0018 |
| 10,269,463 B2 | 4/2019 | Choi et al. |
| 2002/0025406 A1* | 2/2002 | Kitazume ................. B32B 3/10 428/136 |
| 2002/0125824 A1* | 9/2002 | Fukuzawa ................. G03F 7/12 313/640 |
| 2008/0272680 A1 | 11/2008 | Perreault |
| 2009/0090409 A1* | 4/2009 | Moczygemba ......... H01L 35/32 136/201 |
| 2009/0294280 A1* | 12/2009 | Kimura ................ H01G 4/1245 204/192.25 |
| 2011/0131792 A1* | 6/2011 | Kwak .................... H01M 4/139 29/592.1 |
| 2012/0183676 A1* | 7/2012 | Sonoda ................. C23C 14/042 427/8 |
| 2013/0125963 A1 | 5/2013 | Binderbauer et al. |
| 2015/0188019 A1 | 7/2015 | Corrado |
| 2015/0290667 A1* | 10/2015 | Mizumura .......... H01L 21/0332 118/504 |
| 2017/0250381 A1* | 8/2017 | Okawara .................. C23C 14/22 |
| 2017/0288113 A1 | 10/2017 | Choi et al. |
| 2017/0317261 A1* | 11/2017 | Ozturk .................. H01L 35/225 |
| 2017/0342543 A1* | 11/2017 | Ghosh ..................... C23C 14/50 |
| 2017/0343901 A1* | 11/2017 | Ghosh ..................... H01L 21/682 |
| 2018/0340252 A1* | 11/2018 | Vazan ..................... C23C 14/042 |
| 2018/0350481 A1 | 12/2018 | Choi et al. |

OTHER PUBLICATIONS

Stordeur, M. et al., "Low power thermoelectric generator—self-sufficient energy supply for micro systems," 16th Int. Conf. Thermoelectr., 1997, pp. 575-577.
National Aeronautics and Space Administration., "Radioisotope power systems: radioisotope thermoelectric generator (RTG)," 2013, <https://solarsystem.nasa.gov/rps/rtg.cfm> (Jan. 6, 2017 ).
Koelle, D. et al., "Development and transportation costs of space launch systems," Proc. DGLR/CEAS Eur. Air Sp. Conf. (2007).
Swanson, R. M., "A proposed thermophotovoltaic solar energy conversion system," Proc. IEEE, 1979, pp. 446-447, 67(3).
Schock, A. et al., "Design, analysis, and optimization of a radio-isotope thermophotovoltaic (RTPV) generator, and its applicability to an illustrative space mission," Acta Astronaut. 37(C), 1995, pp. 21-57.
Ferrari, C. et al., "Overview and status of thermophotovoltaic systems," Energy Procedia 45, 2014, pp. 160-169.
Bermel, P. et al., "Design and global optimization of high-efficiency thermophotovoltaic systems.," Opt. Express 18 Suppl, 2010, pp. A314-A334, 3(103).
Nelson, R. E., "A brief history of thermophotovoltaic," Semicond. Sci. Technol. 2003, pp. S141-S143, 18.
Crowley, C. J. et al., "Thermophotovoltaic converter performance for radioisotope power systems," AIP Conf. Proc. 2005, 746, pp. 601-614.
Coutts, T. J. "Overview of thermophotovoltaic generation of electricity," Sol. Energy Mater. Sol. Cells, 2001, pp. 443-452, 66(1-4).
Murray, C. S. et al., "Thermophotovoltaic converter design for radioisotope power systems," AIP Conf. Proc. Thermophotovoltaic Gener. Electr. 6th Conf., 2004, pp. 123-132.

Molesky, S. et al., "Ideal near-field thermophotovoltaic cells," Phys. Rev. B, 2015, pp. 1-7, 91(20).
Sulima, O.V. et al., "Fabrication and simulation of GaSb thermophotovoltaic cells," Sol. Energy Mater. Sol. Cells, 2001, pp. 533-540, 66(1-4).
Coutts, T. J., "Review of progress in thermophotovoltaic generation of electricity," Renew. Sustain. energy Rev. 1999, pp. 77-184, 3(2).
Shakouri, A., "Thermoelectric , thermionic and thermophotovoltaic energy conversion J Q (r) q Report Documentation Page", 2005, pp. 1-6.
Rosaire, C. G. et al., "Radioisotope thermophotovoltaic batteries for universal low power systems," Nucl. Emerg. Technol. Space, NETS, 2013, pp. 419-427.
Cheetham, K. J. et al., "Low bandgap GaInAsSbP pentanary thermophotovoltaic diodes," Sol. Energy Mater. Sol. Cells, 2011, pp. 534-537, 95(2).
Nagpal, P. et al., "Efficient low-temperature thermophotovoltaic emitters from metallic photonic crystals," Nano Lett., 2008, pp. 3238-3243, 8(10).
Durisch, W. et al., "Novel thin film thermophotovoltaic system," Sol. Energy Mater. Sol. Cells, 2010, pp. 960-965, 94(6).
Schock, A. et al., "Design and integration of small RTPV generators with new millennium spacecraft for outer solar system," Acta Astronaut. 1997, pp. 801-816, 41(12).
Gerstenmaier, Y. C. et al., "Efficiency of thermionic and thermo-electric converters," AIP Conf. Proc., 2007, pp. 37-46, 890.
Oman, H. "Deep space travel energy sources," IEEE Aerosp. Electron. Syst. Mag., 2003, 18(2), pp. 28-35.
Humphrey, T. E. et al., "Power optimization in thermionic devices," J. Phys. D. Appl. Phys., 2005, pp. 2051-2054, 38(12).
Trucchi, D. M. et al., "Thermionic Emissions□: A Different Path to Solar Thermal Electricity," SolarPaces Conf. (2012).
Schwede, J. W. et al., "Photon-enhanced thermionic emission for solar concentrator systems," Nat. Mater., 2010, pp. 762-767, 9(9),Nature Publishing Group.
Adams, S. F., "Solar thermionic space power technology testing: A historical perspective," AIP Conf. Proc., 2006, pp. 590-597, 813.
Ha, C. T. et al., "Advanced stirling radioisotope generator: Design processes, reliability analyses impacts, and extended operation tests," AIP Conf. Proc., 2008, pp. 458-465, 969.
Chan, J. et al., "Development of advanced Stirling Radioisotope Generator for space exploration," AIP Conf. Proc. , May 2007, pp. 615-623, 880.
Wong, W. A. et al., "Advanced Stirling convertor ( ASC )—from technology development to future flight product," 2008, pp. 1-26.
Cockfield, R. D. et al., "Stirling radioisotope generator for mars surface and deep space missions," 2002 37th Intersoc. Energy Conyers. Eng. Conf., 2002, pp. 134-139.
Shaltens, R. K. et al., "Advanced Stirling technology development at NASA Glenn Research Center," NASA Sci. Technol. Conf.(Sep.) (2007).
Oriti, S. M., "Advanced Stirling Radioisotope Generator Engineering Unit 2 ( ASRG EU2 ) final assembly" (2015).
Mason., L. S. et al., "Modular stirling radioisotope generator," 13th Int. Energy Convers. Eng. Conf., 2015, 3809.
Chan, T. S., "System-level testing of the advanced Stirling radio-isotope generator engineering hardware," 12th Int. Energy Convers. Eng. Conf. (2014).
Chan, J. et al., "Advanced stirling radioisotope generator emergency heat dump test for nuclear safety consideration," 9th Annu. Int. Energy Convers. Eng. Conf. IECEC 2011 (2011).
Leonov, V et al., "Wearable thermoelectric generators for body-powered devices," J. Electron. Mater., 2009, pp. 1491-1498, 38(7).
Leonov, V et al., "Thermoelectric and hybrid generators in wearable devices and clothes," Proc.—6th Int. Work. Wearable Implant. Body Sens. Networks, 2009, pp. 95-200.
Wang Z. L et al., "Realization of a wearable miniaturized thermo-electric generator for human body applications," Sensors Actuators, A Phys. 2009, pp. 95-102, 156(1).
Leonov, V, "Thermoelectric energy harvesting of human body heat for wearable sensors," IEEE Sens. J., 2013, pp. 2284-2291, 13(6).

(56) References Cited

OTHER PUBLICATIONS

Kim, M. K. et al., "Wearable thermoelectric generator for human clothing applications," 2013 Transducers Eurosensors XXVII 17th Int. Conf. Solid-State Sensors, Actuators Microsystems(Jun.), 2013, pp. 1376-1379.

He, W. et al., "Recent development and application of thermoelectric generator and cooler," Appl. Energy, 2015, pp. 1-25, 143.

Bahk, J. H. et al., "Flexible thermoelectric materials and device optimization for wearable energy harvesting," J. Mater. Chem. C 3, 2015, pp. 10362-10374.

Sebald, G. et al., "On thermoelectric and pyroelectric energy harvesting," Smart Mater. Struct. 2009,18(12), p. 25006, pp. 1-7.

Miotla, D., "Assessment of plutonium-238 production alternatives," Apr. 21, 2008 (available at http://energy.gov/sites/prod/files/NEGTN0NEAC_PU-238_042108.pdf), downloaded on Oct. 4, 2018.

National Aeronautics and Space Administration., "What is plutonium-238☐?," <https://solarsystem.nasa.gov/rps/docs/APP RPS Pu-238 FS Dec. 10, 2012.pdf> (Jan. 25, 2016 ), downloaded on Oct. 4, 2018.

Howe, S. D. et al., "Economical production of Pu-238," Nucl. Emerg. Technol. Sp. (NETS 2013) 2013, pp. 1-12, 238.

Wall, M., "Full-Scale Production of Plutonium Spacecraft Fuel Still Years Away," Space.com, May 17, 2016, (available at http://www.space.com/32890-nuclear-fuel-spacecraft-production-plutonium-238.html), downloaded on Oct. 4, 2018.

Griggs, M. B., "Plutonium-238 is produced in America for the first time in almost 30 Years," Pop. Sci., Dec. 23, 2015 (available at http://www.popsci.com/plutonium-238-is-produced-in-america-for-first-time-in-30-years), downloaded on Oct. 4, 2018.

Szondy, D., "US restarts production of plutonium-238 to power space missions," New Atlas, Dec. 23, 2015 (available at http://newatlas.com/ornl-plutonium-238-production-space/41041/), downloaded on Oct. 4, 2018.

L. Popa-Simil, I.L. Popa-Simil, "Nano Hetero Nuclear Fuel Structure," NSTI-Nanotech, 2007, vol. 1, LAVM LLC, Los Alamos, NM 87544.

* cited by examiner

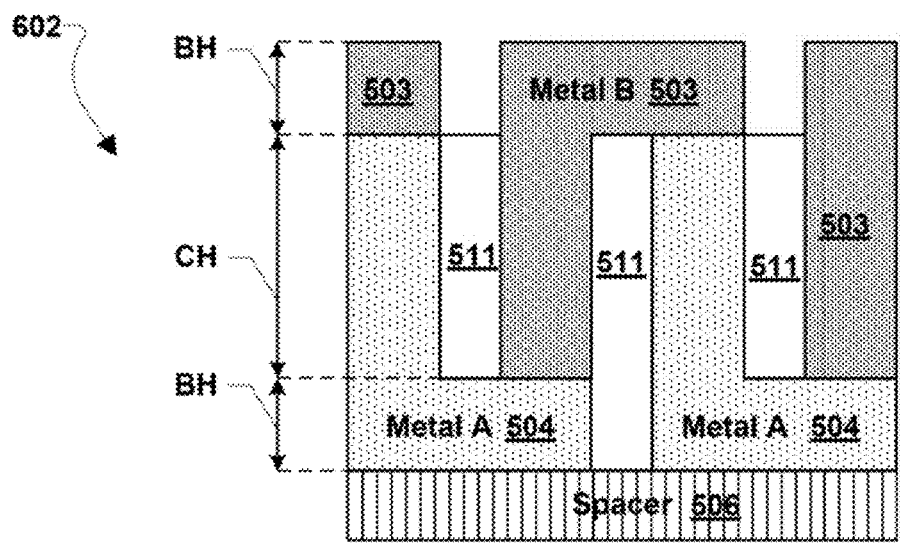
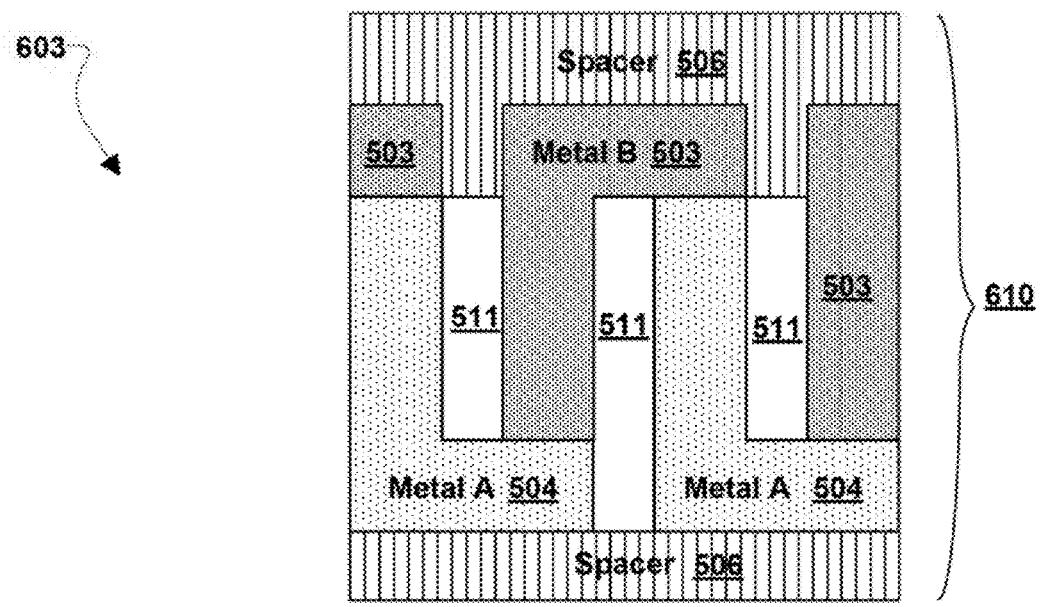
FIG. 6B

SELECTIVE AND DIRECT DEPOSITION TECHNIQUE FOR STREAMLINED CMOS PROCESSING

CROSS-REFERENCE TO RELATED PATENT APPLICATION(S)

This patent application claims the benefit of and priority to U.S. Provisional Patent Application No. 62/621,930, filed on Jan. 25, 2018, the contents of which is hereby incorporated by reference in its entirety.

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

BACKGROUND OF THE INVENTION

The desire for alternative energy sources has pushed thermal energy conversion efforts in recent decades. Thermoelectric junctions made of semiconductors have existed in radioisotope thermoelectric generators (RTGs) for deep space missions, but are currently being adapted for terrestrial energy harvesting. Unfortunately, current thermoelectric devices having thermoelectric junctions made of semiconductors are inefficient, operating at only 7% efficiency. This has driven efforts to make high figure of merit thermoelectric devices, which require a high electrical conductivity but a low thermal conductivity, two properties that contradict one another. Previous efforts to lower thermal conductivity have increased efficiency, but at the cost of power output, which relies on thermal heat flux to generate power.

An additional barrier to current thermoelectric devices having thermoelectric junctions made of semiconductors is that current microfabrication methods for semiconductors require a long list of steps. Current microfabrication methods are well established for processing of a silicon (Si)-based complementary metal-oxide-semiconductor (CMOS) and rely on repeated steps, such as masking, patterning of a photoresist, lithography, selective wet and dry chemical etching, deposition, and chemical mechanical polishing are staples of the semiconductor industry. The list of steps becomes longer for each new technology iteration. This is especially true for three-dimensional (3D) transistors, as these require very selective placement and removal of deposited material. Each time this selective placement and removal happens, steps of photoresist application, masking, ultraviolet (UV) exposure, selective etching, deposition, planarization, are all necessary in current microfabrication methods.

BRIEF SUMMARY OF THE INVENTION

Systems, methods, and devices of the various embodiments provide for microfabrication of devices, such as semiconductors, thermoelectric devices, etc. Various embodiments may include a method for fabricating a device, such as a semiconductor (e.g., a silicon (Si)-based complementary metal-oxide-semiconductor (CMOS), etc.), thermoelectric device, etc., using a mask. In some embodiments, the mask may be configured to allow molecules in a deposition plume, such as a sputtering plume or any other vacuum type deposition method plume (e.g., electron beam evaporation, molecular beam epitaxy, etc.), to pass through one or more holes in the mask. In some embodiments, molecules in a deposition plume may pass around the mask. Various embodiment methods using deposition (e.g., sputtering, electron beam evaporation, molecular beam epitaxy, etc.) and masks may enable material to go where desired. Various embodiment methods using deposition and masks may enable the fabrication of a semiconductor, such as a Si-based CMOS, etc., without a photoresist step, and without the need for a selective etching step. In this manner, various embodiments may simplify the fabrication process for a semiconductor, such as a Si-based CMOS, etc., reducing cost and chemical waste, and increasing throughput from a faster process when compared to conventional microfabrication methods for a semiconductor.

Various embodiments may provide thermoelectric devices having metallic junctions. Various embodiments may provide thermoelectric devices having metallic junctions rather than junctions formed from semiconductors.

Various embodiments may provide a method for fabricating a device, the method including providing a surface on which a metal or metal alloy is to be deposited, suspending a first mask having a first hole pattern above the surface and between the surface and an outlet of a deposition system, and depositing a first amount of the metal or metal alloy from the outlet of the deposition system through holes in the first mask on to the surface. The method may further include removing the first mask, suspending a second mask having a second hole pattern above the surface and between the surface and the outlet of the deposition system, and depositing a second amount of the metal or metal alloy from the outlet of the deposition system through holes in the second mask on to the surface, wherein the second hole pattern is different than the first hole pattern. The second mask may be suspended above the surface at a different height than the first mask. The method may further include removing the second mask, suspending a third mask having a third hole pattern above the surface and between the surface and the outlet of the deposition system, and depositing an insulator from the outlet of the deposition system through holes in the third mask on to the surface, wherein the third hole pattern is different than the first hole pattern and the second hole pattern. The third mask may be suspended above the surface at a different height than the first mask and the second mask. The device may be a CMOS. The first mask may be suspended above the surface at a height of 40 micrometers (μm) or less. The device may be a thermoelectric device. The metal or metal alloy may include nickel.

Various embodiments may provide a thermoelectric device including a first material including at least a portion of a first metal or metal alloy and a second material including at least a portion of a second metal or metal alloy, the second material contacting the first material at one or more junctions, wherein the first metal or metal alloy and the second metal or metal alloy are dissimilar metals or metal alloys. The first material and the second material may be formed into one or more junction layers. The one or more junction layers may be two or more junction layers. The two or more junction layers may be eight junction layers. A crossbeam height of the first material and the second material may be the same. The crossbeam height may be 9 μm or greater. The one or more junction layers may be two or more junction layers and the junction layers may be separated by layers of spacer material. The spacer material may be any material that is both thermally conductive and electrically insulative, such as undoped silicon, diamond, etc. A height of the spacer material may be 10 µm or less. One or both of the first material and the second material may be metals, metal alloys, semi-metallic compounds, or semiconductors.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

FIGS. 6A-6E are block diagrams illustrating steps of an embodiment method for fabricating an embodiment metallic junction thermoelectric device.

DETAILED DESCRIPTION OF THE INVENTION

Figure 1:
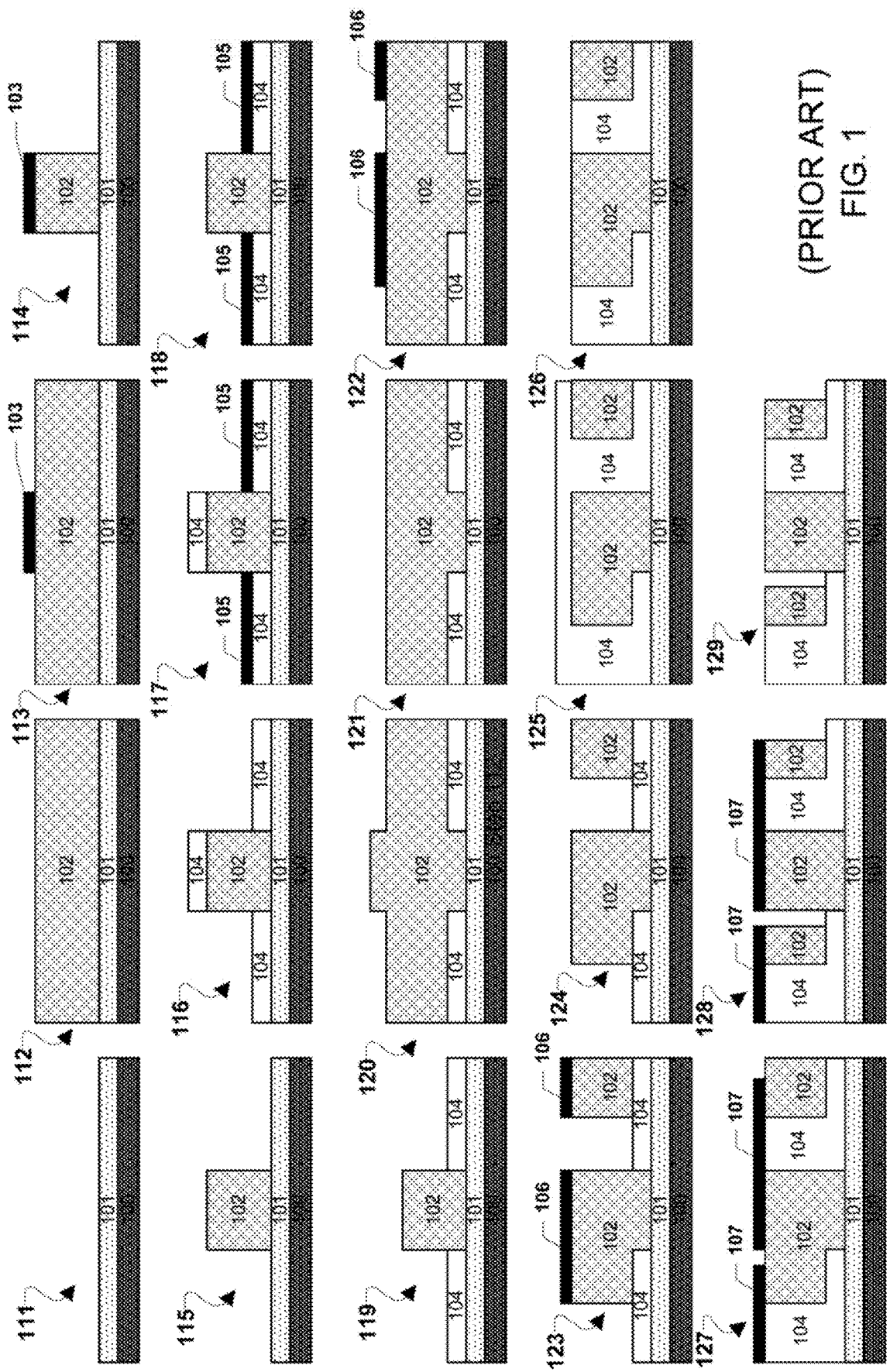
FIG. 1 is a block diagram illustrating steps of a prior art microfabrication method for forming a semiconductor.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations and step sequences, except where expressly specified to the contrary. For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The word "exemplary" is used herein to mean "serving as an example, instance, or illustration." Any implementation described herein as "exemplary" is not necessarily to be construed as preferred or advantageous over other implementations.

The various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the invention or the claims.

Current complementary metal-oxide-semiconductor (CMOS) fabrication is effective, but laborious as the number of steps for each technology increases and devices get more complex. Three-dimensional (3D) Fin Field-effect transistor (FinFET) structures are an example of this current laborious fabrication, where the amount of selective etching steps required is extremely high. Rather than opening holes in oxide layers for dopant deposition, etching is now used to create the trenches between fins in the FinFET in current fabrication methods, and then again to remove coatings and deposited materials off of the tips of each fin to a certain extent. Every time a process requires selective application of techniques such as etching and deposition that are inherently non-selective, a number of steps before the etching and deposition are needed in current fabrication methods. For example, the conventional fabrication method can be as follows: 1) Apply photoresist evenly to a wafer surface; 2) Set an ultraviolet (UV) mask over the wafer (the mask is transparent to UV light, except in areas covered with metal to block UV transmission); 3) Expose the masked wafer to UV light, resulting in a chemical change to the exposed photoresist; 4) Dissolve the exposed photoresist; 5) Etch away silicon dioxide ($SiO_2$), leaving patterned holes in the oxide layer; 6) Clean off photoresist; 7) Etch or deposit desired material into the oxide pattern; 8) Diffuse deposited material into the substrate; 9) Re-oxidize surface and fill in oxide holes; and 10) Planarize uneven oxide to flat once again. The particulars of the conventional vary for what is necessary in the design, but it is clear that any selective part of the process needs photoresist application, masking, exposure, and etching before deposition. These require separate tools, or tools that can accomplish multiple steps at once (apply, mask, expose), all of which increases cost and complexity. The current CMOS manufacturing practice relies on increasing amounts of selective patterning and each layer added to the CMOS requires the addition of another series of steps 1-7 listed above. As every new generation of computer processor increases the number of layers in the CMOS; the number of patterning steps required has increased in current CMOS manufacturing.

Various embodiments provide a streamlined alternative to current CMOS fabrication methods. The various embodiments may eliminate many etching and patterning steps when compared with current CMOS fabrication methods. For example, the embodiment streamlined fabrication method may achieve in only one step the result of steps 1-7 listed above in the current CMOS fabrication methods. Current MOS fabrication methods require many tools, such as a photoresist spinner, a mask aligner, a UV exposure, a chemical etcher, and a photoresist cleaner, all necessary before deposition. The embodiment streamlined fabrication method may only require a mask aligner before deposition. The embodiment streamlined fabrication method may have a shorter process time than current CMOS fabrication methods. The embodiment streamlined fabrication method may be less expensive than current CMOS fabrication methods because less equipment may be required in the embodiment fabrication method and less labor and maintenance may be required in the embodiment fabrication method. The embodiment fabrication method may achieve more device yield per unit time than current CMOS fabrication methods. The embodiment fabrication method may result in less defects than current CMOS fabrication methods because the embodiment fabrication method may require less wafer transport and less contact with tools than current CMOS fabrication methods.

Systems, methods, and devices of the various embodiments provide for microfabrication of devices, such as semiconductors, thermoelectric devices, etc. Various embodiments may include a method for fabricating a device, such as a semiconductor (e.g., a silicon (Si)-based complementary metal-oxide-semiconductor (CMOS), etc.), thermoelectric device, etc., using a mask. The various embodiments leverage masks that permit deposited material through (and/or around), rather than conventional masks that use a transparent medium for permitting UV light through in the patterned area. In some embodiments, the mask may be configured to allow molecules in a deposition plume, such as a sputtering plume or any other vacuum type deposition method plume (e.g., electron beam evaporation, molecular beam epitaxy, etc.) to pass through one or more holes in the mask. In some embodiments, molecules in a deposition plume may pass around the mask. Various embodiment methods using deposition (e.g., sputtering, electron beam evaporation, molecular beam epitaxy, etc.) sputtering and masks may enable material to go where desired. Various embodiment methods using deposition and masks may enable the fabrication of a semiconductor, such as a Si-based CMOS, etc., without a photoresist step, and without the need for a selective etching step. In this manner, various embodiments may simplify the fabrication process for a semiconductor, such as a Si-based CMOS, etc., reducing cost and chemical waste, and increasing throughput from a faster process when compared to conventional microfabrication methods for a semiconductor.

FIG. 1 illustrates a standard prior CMOS-based process using current fabrication steps. As shown in FIG. 1, a certain 3D feature is fabricated in 19 steps (steps 111-129), including the wafer 101 preparation. In step 111, the wafer 101, such as a Si wafer, may be provided on a substrate 100. In step 112, deposition of an insulator 102 on the wafer 101 may occur. In step 113, photoresist and a metal mask 103 may be applied on the surface of the insulator 102 and UV exposure may occur. In step 114, the insulator not covered by the metal mask 103 may be etched away. In step 115, the metal mask 103 and photoresist is removed. In step 116, deposition of a first metal 104 may occur. In step 117, a metal mask 105 may be applied on the surface of the first metal 104 that is not to be removed by etching. In step 118, the first metal 104 not covered by the metal mask 105 may be removed by etching. In step 119, the metal mask 105 may be removed and the surface of the remaining surface of the first metal 104 may be cleaned. In step 120, deposition of additional insulator 102 may occur. In step 121, the insulator 102 may be smoothed by chemical mechanical polishing (CMP). In step 122, a metal mask 106 may be applied on the surface of the insulator 102 that is not to be removed by etching. In step 123, the insulator 102 may be etched. In step 124, the mask 106 may be removed and the surface cleaned. In step 125, deposition of additional first metal 104 may occur. In step 126, the surface may be etched to expose the first metal 104 and the insulator 102. In step 127, a metal mask 107 may be applied on the surface of the first metal 104 and insulator 102 that is not to be removed by etching. In step 128, the insulator 102 may be removed by etching. In step 129, the metal mask 107 may be removed and the surfaces cleaned.

Figure 2:
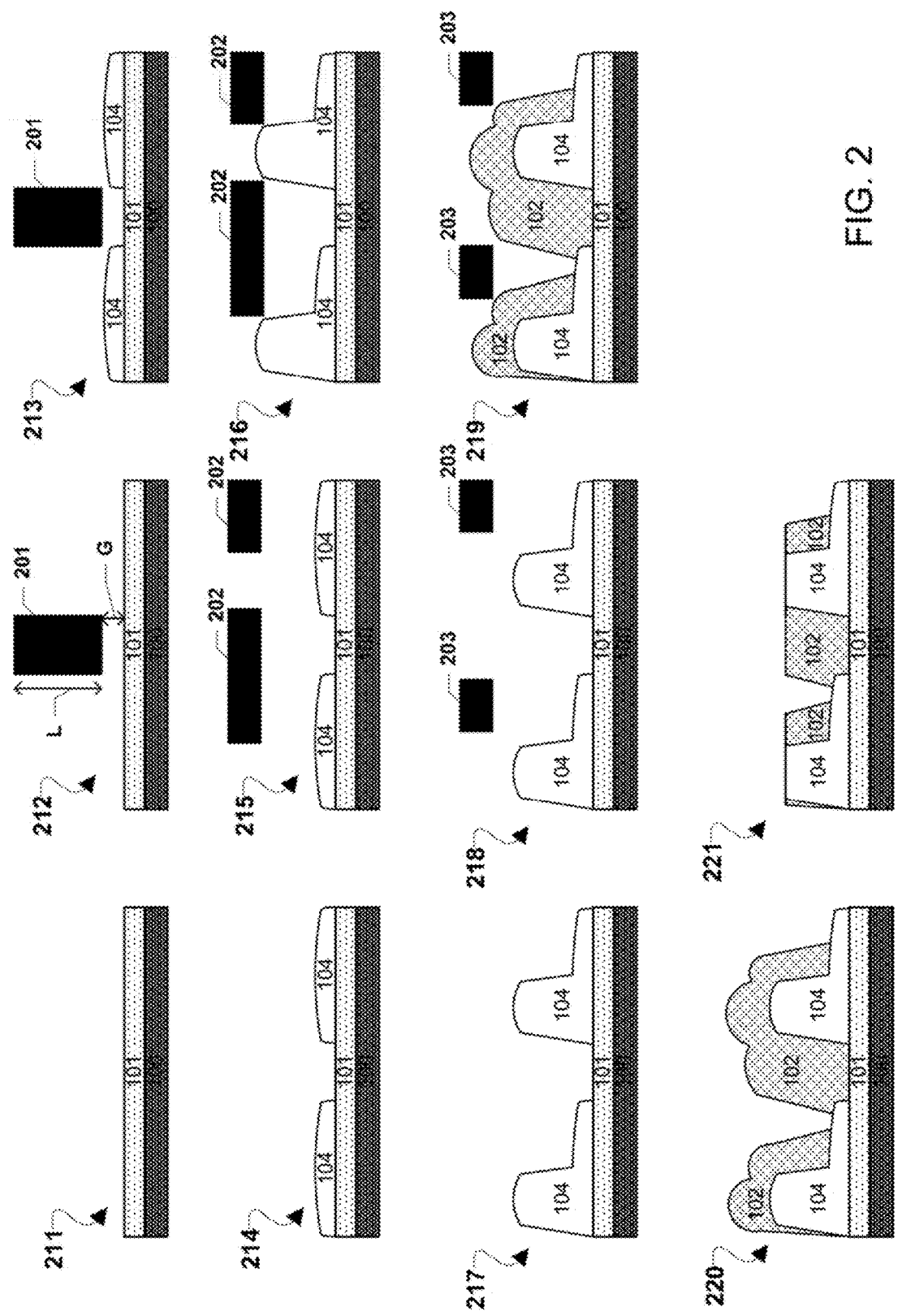
FIG. 2 is a block diagram illustrating steps of an embodiment method for fabricating a device using sputtering and one or more mask.

FIG. 2 illustrates an embodiment streamlined fabrication method using different masks 201, 202, and 203 suspend various distances above the surface for deposition. The mask 201 may allow molecules in a deposition plume, such as a sputtering plume or any other vacuum type deposition method plume (e.g., electron beam evaporation, molecular beam epitaxy, etc.), to pass around and be deposited on a surface above which the mask 201 is suspended (i.e., not in contact with). The masks 202 and 203 may be configured to allow molecules in a deposition plume to pass through one or more holes in the masks 202 and 203 and be deposited on surfaces above which the masks 202 and 203 are suspended (i.e., not in contact with). The embodiment method illustrated in FIG. 2 accomplishes a similar result as the prior art method illustrated in FIG. 1, but the method illustrated in FIG. 2 accomplishes the fabrication in far less steps 211-221. Rather than a global deposition and then local material removal, in the embodiment method illustrated in FIG. 2 mask 201, 202, and 203 are suspend over areas that do not need deposited material, causing local deposition instead. It is notable that the molecular plume is still Gaussian in its spread, producing non-square features. Mitigation of this effect is discussed below and shown in FIG. 2 through the use of different masks 201, 202, 203 and different heights above the surface. Despite this Gaussian spread, the shape and size of the finished device are within tolerance. No etching steps, no photoresist patterning, and no metal removal is necessary. Other than planarization by polishing, selective deposition in the embodiment method illustrated in FIG. 2 has replaced every step in the conventional process shown in FIG. 1, accomplishing the same result in far less steps.

Specifically, the steps in the embodiment method illustrated in FIG. 2 include, in step 211, the wafer 101, such as a Si wafer, may be provided on a substrate 100. While a wafer 101 on a substrate 100 is illustrated in FIG. 2, any surface for deposition (i.e., a surface selected and/or configured to have materials deposited thereon) may be substituted for the wafer on a substrate 100 illustrated in FIG. 2 and the operations of the method illustrated in FIG. 2 may be applied to deposit material on any surface. In step 212, a mask 201 may be suspended away from (e.g., above, below, etc.) the surface of the wafer 101. The mask 201 may have a mask length "L" and may be suspended away from (e.g., above, etc.) the surface a distance "G". As an example, the mask length "L" may be greater than 500 micrometers (μm) and the mask 201 may be suspended a distance "G" of approximately 40 μm away from (e.g., above, etc.) the surface of the wafer 101. The mask 201 may be suspended away from (e.g., above, etc.) the surface of the wafer 101 and between one or more outlets of a deposition system (e.g., a sputtering gun, molecular beam epitaxy effusion cells, deposition material crucible, etc.). As such, the mask 201 may be suspended between the one or more outlets of the deposition system such that the mask 201 is located between the source of the materials to be deposited by the deposition system and the surface of the wafer 101. In step 213, the deposition system may deposit a first thickness of a first metal 104 on the surface of the wafer 101. The deposited first thickness may be at any height, such as a number of micrometers (μm), a number of nanometers (nm), etc. For example, the deposited first thickness of the first metal 104 may be approximately 30 μm. The plume of incoming atoms and molecules output by the deposition system may be diverted by the mask 201 such that the first metal 104 may be deposited around the mask 201. In step 214, the mask 201 may be removed. In step 215, a mask 202 may be positioned (e.g., suspended) away from (e.g., above, etc.) the surface of the first metal 104 and wafer 101. The mask 202 may include holes therein. The mask 202 may be suspended away from (e.g., above, etc.) the surface of the first metal 104 and wafer 101 and between one or more outlets of the deposition system. In step 216, the deposition system may deposit a second thickness of the first metal 104 on portions of the first metal 104 already deposited on the wafer 101. The deposited second thickness may be at any height, such as a number of micrometers (μm), a number of nanometers (nm), etc. For example, the second thickness may be approximately 100 μm. The plume of incoming atoms and molecules output by the deposition system may be diverted by the mask 202 through the holes in the mask 202 to the first metal 104 and/or wafer 101 surfaces. In this manner, the incoming atoms and molecules may deposit in deposition footprints aligned with (e.g., located under) the holes in the mask 202. In step 217, the mask 202 may be removed. In step 218, a mask 203 may be positioned (e.g., suspended) away from (e.g., above, etc.) the surface of the first metal 104 and wafer 101. The mask 203 may include holes therein. The hole pattern in the mask 203 may be different than the hole pattern in the mask 202. The mask 203 may be suspended away from (e.g., above, etc.) the surface at a different height than the mask 202 was suspended. The mask 203 may be suspended away from (e.g., above, etc.) the surface of the first metal 104 and wafer 101 and between one or more outlets of a deposition system (e.g., a sputtering gun, etc.). In step 219, the deposition system may deposit a first thickness of insulator 102. The deposited first thickness of insulator 102 may be at any height, such as a number of micrometers (μm), a number of nanometers (nm), etc. The plume of incoming atoms and molecules output by the deposition system may be diverted by the mask 203 through the holes in the mask 203 to the first metal 104 and/or wafer 101 surfaces. In this manner, the incoming atoms and molecules may deposit in deposition footprints aligned with (e.g., located under, etc.) the holes in the mask 203. In step 220, the mask 203 may be removed. In step 221, the surfaces may be polished to expose a portion of the first metal 104 through the insulator 102.

In various embodiments, mask manufacturing technology may be adapted to hollow out the patterns in the material, rather than pattern the negative in metal to block UV exposure. In various embodiments, 3D printing may be used for manufacturing method for the masks, such as masks 201, 202, 203. In various embodiments, deposition systems may rotate wafers and masks in tandem. For example, chucks may grip both the wafer and masks at the necessary separation distance between the two. In the various embodiments, maintenance is expected to be reduced in comparison to conventional processes given the reduction in equipment experienced in the embodiment methods. The masks themselves are low maintenance, and may build up deposit in the pattern holes and on the surface. This deposit on the masks may be removed easily with an etchant after each use, a fast and simple process. Masks will also need to be cleaned regularly, possibly after each use. Some deposit may adhere to the sides of the mask holes, constricting the footprint and changing the final feature deposited onto the wafer.

Various embodiment fabrication methods using masks that permit deposited material through (and/or around) may shorten the patterning process for deposition, skipping the need for photoresist and UV exposure need in conventional fabrication methods. Various embodiment fabrication methods using masks that permit deposited material through (and/or around) may have lower cost of fabrication than conventional methods. Various embodiment fabrication methods using masks that permit deposited material through (and/or around) may have a reduced environmental impact when compared to conventional methods because less chemicals are needed and therefor less chemicals are disposed of. Various embodiment fabrication methods using masks that permit deposited material through (and/or around) may result in less material waste from etching away undesirable deposition than in conventional methods. CMOS device size is currently approaching 10 μnm which is the current testing limit for conventional patterning resolution making fabricating CMOS device sizes smaller than 10 nm difficult with conventional manufacturing techniques. Part of the difficulty in conventional CMOS manufacturing techniques comes from the wafer needing to be exposed repeatedly to short wavelength extreme UV to pattern the features. In contrast, the various embodiment fabrication methods may enable a CMOS device to only be patterned once thereby reducing (or eliminating) the UV exposure compared to conventional manufacturing techniques. The various embodiment fabrication methods may enable techniques such as electron beam or ion beam lithography to be used to limit patterning in the various embodiment fabrication methods to once, rather than thousands of times as experienced in conventional manufacturing techniques.

Various embodiment fabrication methods using masks that permit deposited material through (and/or around) may be suitable for meeting the device quality and performance levels for devices with less strict requirements than CMOSs. Various embodiment fabrication methods using masks that permit deposited material through (and/or around) may be effective for fabrication of group III-V and II-VI semiconductors which do not have proper gate oxides. Production of most devices built with the Groups II-VI and III-V semiconductors has a distinctive difficulty due mainly to the lack of proper gate oxides that are needed in the CMOS fabrication process. Various embodiment fabrication methods using masks that permit deposited material through (and/or around) may alleviate such difficult steps by simply and directly writing and developing the structure of gate oxide through the masked deposition of a selected oxide onto a chipset layout. Various embodiment fabrication methods using masks that permit deposited material through (and/or around) may be easily used to fabricate custom chips and specialized sensors and devices that use the group III-V semiconductor materials.

Mask distance from the surface is of vital importance in the various embodiments. The sputtering plume consists of molecules traveling in many trajectories. While the various embodiment masks allow only molecules traveling downward, the width of the patterned holes in the mask permits a certain amount of lateral trajectory. As such, a molecule starting at one edge of the hole, traveling away from the edge, may reach the bottom and adhere to the surface under the mask, not within the hole footprint. This is a loss of resolution, decreasing the selectiveness somewhat. The thicker the mask, the smaller the hole, and the closer the mask to the wafer, the less this stray deposition is a problem. Making a mask thicker is easy to accomplish. The size of the hole in the mask is dictated by design. The closeness of the mask to the substrate surface may be controlled by correctly positioning the mask quickly, and within microns or even nanometers of the substrate surface, without touching the substrate surface. If accomplished, this deposition spreading will be largely eliminated.

Figure 3A:
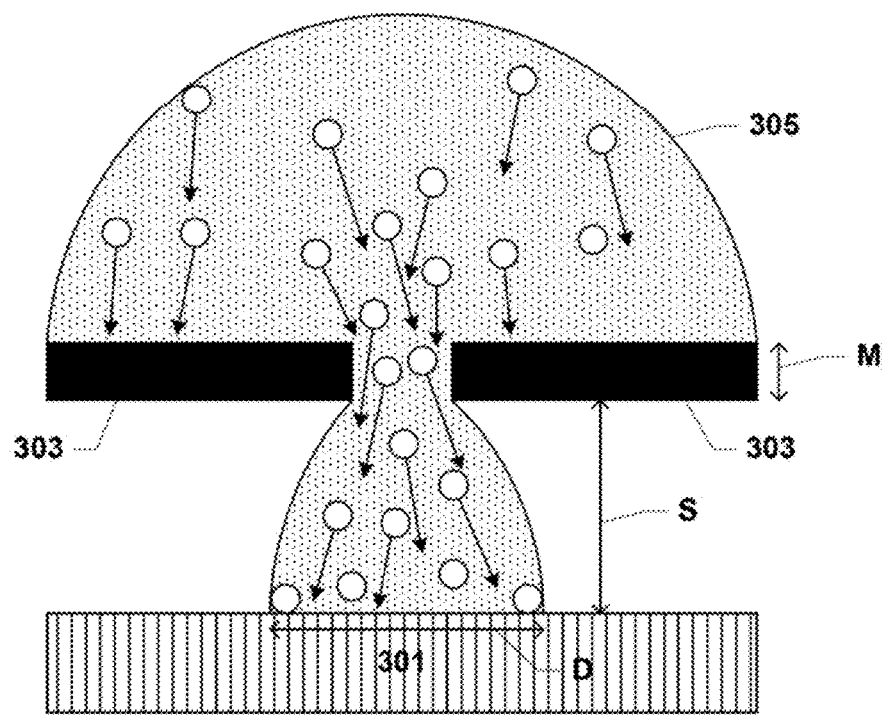
FIG. 3A is a block diagram illustrating impacts of mask to substrate distance and mask thicknesses on a deposition footprint.
Figure 3B:
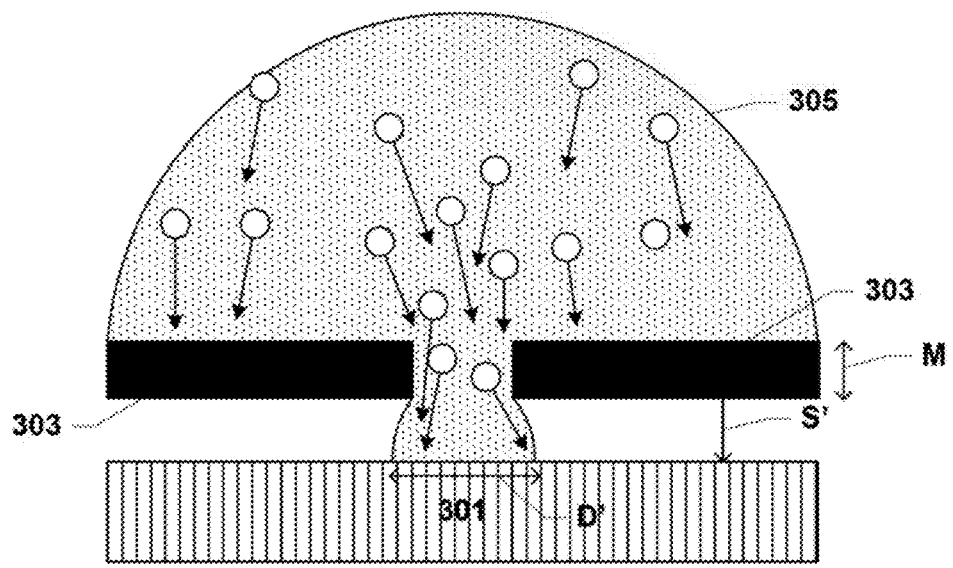
FIG. 3B is a block diagram illustrating impacts of mask to substrate distance and mask thicknesses on a deposition footprint.
Figure 3C:
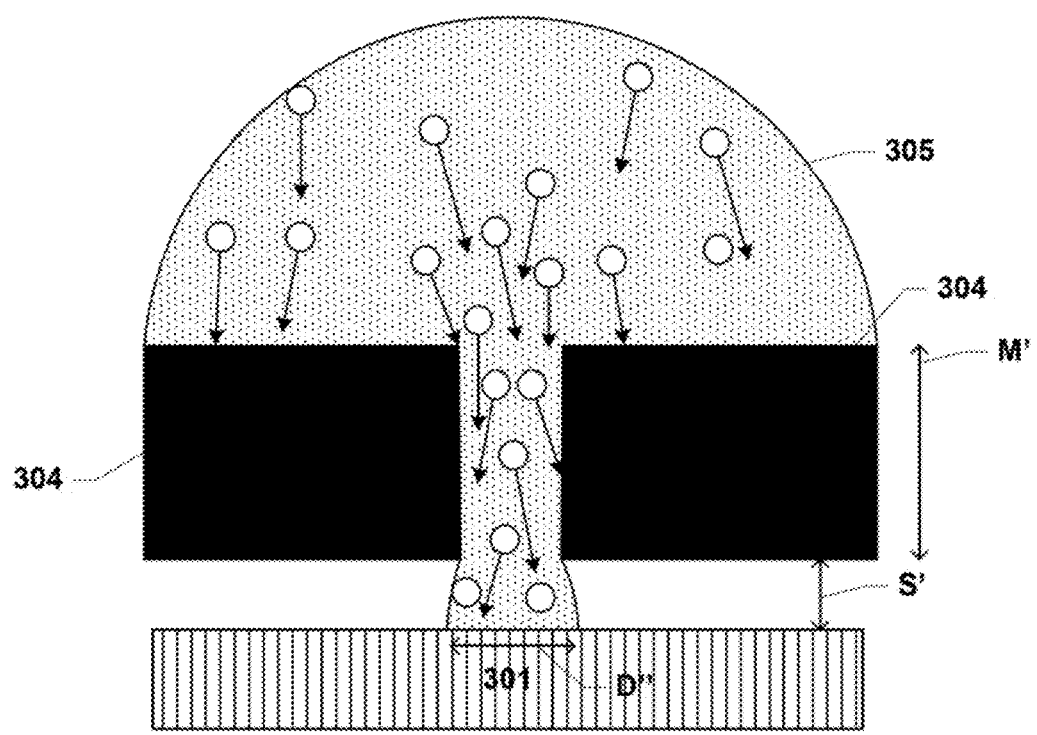
FIG. 3C is a block diagram illustrating impacts of mask to substrate distance and mask thicknesses on a deposition footprint.

FIGS. 3A, 3B, and 3C illustrate the effects of mask selection and distance between the mask and a substrate when a plume 305 of incoming atoms and molecules is sputtered from above the mask onto a substrate 301. FIGS. 3A and 3B show a mask 303 with a mask thickness "M" suspended two different distances "S" and "S'", respectively, above the substrate 301. FIG. 3C shows a mask 304 with a mask thickness "M'" suspended a distance "S'" above the substrate 201. The masks 303 and 304 both have the same width hole opening therein. Comparing FIGS. 3A, 3B, and 3C, a large gap (distance S in FIG. 3A) permits molecules with a large lateral velocity to travel well under the shadowed regions of the substrate 301 providing a wide deposition footprint "D". A small gap (distance S' in FIG. 3B) with the same mask thickness M mitigates this behavior, constraining the deposited feature more to the region of interest and providing a narrow deposition footprint "D'". Finally, a thicker mask (mask 304 with thickness M') limits the incoming molecules to a lower lateral velocity, also mitigating the problem and providing an even narrower deposition footprint "D'".

Current thermoelectric power conversion methods rely on semiconductor devices. The heat source causes a migration of excess electrons and holes in the n- and p-type semiconductor legs, resulting in a current flow. Efficiency and device quality are often compared with the figure of merit ZT, given in Eq. (1) as follows:

$$ZT=(S^2\sigma T)/\kappa \quad (1)$$

Figure 4:
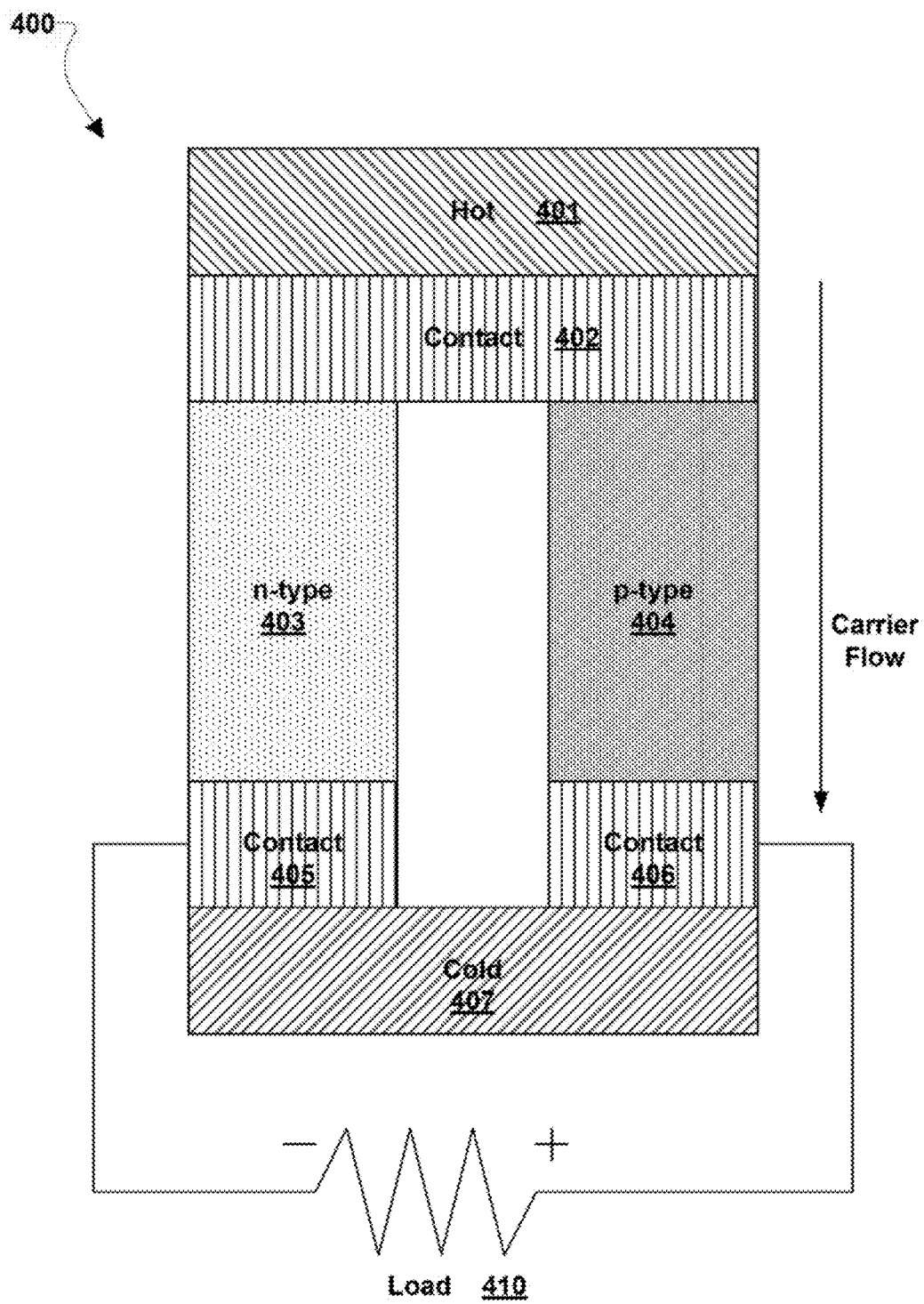
FIG. 4 is a block diagram of a prior art semiconductor-based thermoelectric device.

In Equation (1), ZT is the dimensionless figure of merit, S is the Seebeck coefficient of the two materials at the junction in V/K, $\sigma$ is the electrical conductivity in $1/\Omega \cdot m$, T is absolute temperature in K, and $\kappa$ is thermal conductivity in $W/m \cdot K$. Attempts to manipulate the figure of merit often result in synthesizing materials or fabricating complex device structures with a high $\sigma$ and a low $\kappa$, a rather unnatural combination. Despite decades of intense research to increase the ZT figure of merit, thermoelectric device construction has fundamentally not varied from that shown in FIG. 4. FIG. 4 illustrates a prior art semiconductor-based thermoelectric device 400 relying on thermal migration of electrical carriers from the hot end 401 to the cold end 407 through contacts 402, n-type 403 and p-type 404 semiconductors, and contacts 405 and 406 to generate electrical potential and provide current through the load 410. Thermoelectric devices constructed in the manner of device 400 suffer from a low conversion efficiency of 7%. For typical radioisotope thermoelectric generators (RTGs), this comes to about 5W of electrical power per kg, or $W_e$/kg. Moreover, as $\kappa$ continues to shrink, the figure of merit increases, but at a cost to power density. At a $\kappa$ of 0, all heat flow would cease. No thermal energy movement is possible, and thus no temperature gradient is possible, and thus no carriers and no power would be generated. At a cost of approximately $10,000/kg payload at the lowest end, such low efficiency and power density are unsuitable for the rapidly expanding space technology sector and further efforts at manned space exploration.

Increased efficiency can be achieved with a different approach. Metals have a high thermal and electrical conductivity, and a large number of carriers compared to semiconductors. Various embodiments may provide thermoelectric devices having metallic junctions. Various embodiments may provide thermoelectric devices having metallic junctions rather than junctions formed from semiconductors. Various embodiments provide thermoelectric devices in which two different metals and/or metal alloys contact one another. The junction of the two different metals and/or metal alloys in such embodiment thermoelectric devices produces a net Seebeck effect voltage at each junction between the two different metals and/or metal alloys and drives a current through a load. No elaborate combination of material properties is necessary in the various embodiment thermoelectric devices having metallic junctions, only a pairing of metals and/or metal alloys that produces a high Seebeck voltage. The various embodiment thermoelectric devices having metallic junctions use the Seebeck effect at the junctions between the dissimilar metals and/or metal alloys. The higher electron concentration and carrier mobility inherent in metals enables higher power conversion efficiency when compared with semiconductor-based thermoelectric devices.

Figure 5:
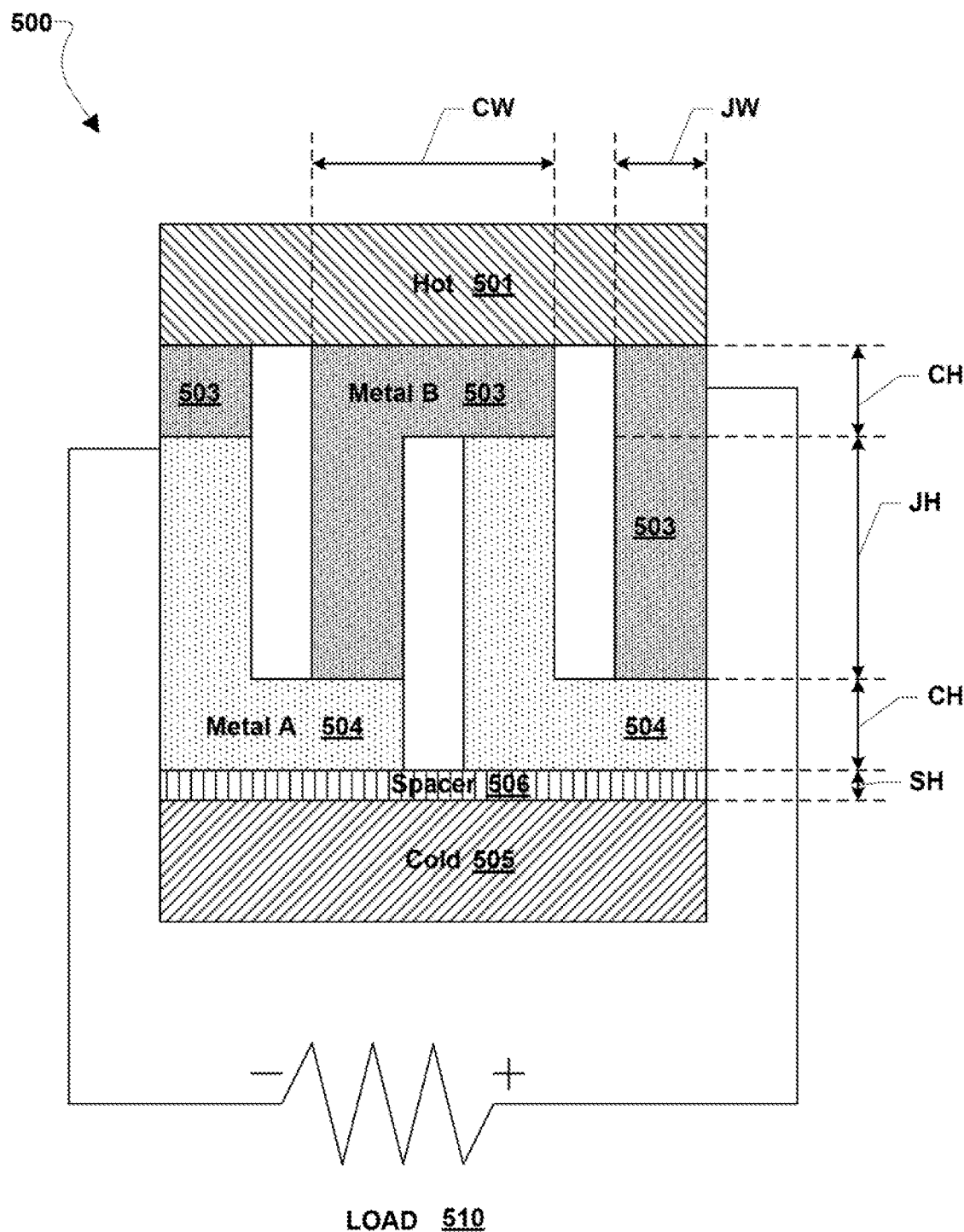
FIG. 5 is a block diagram of an embodiment metallic junction thermoelectric device.

FIG. 5 illustrates an embodiment thermoelectric device 500 having metallic junctions. A first metal and/or metal alloy, metal A 504, and a second metal and/or metal alloy, metal B 503, provide Seebeck junctions at each interface (i.e., contact point or junction) between metal A 504 and metal B 503. In embodiment metallic junction thermoelectric devices, such as thermoelectric device 500, the metals and/or metal alloys (e.g., metal A 504 and metal B 503) of the device may interface directly with one another at different junctions. As such, the two different metals and/or metal alloys may directly contact one another at the different junctions without the need for additional contacts or connections between the different metals and/or metal alloys. These metallic junctions where the different metals and/or metal alloys (e.g., metal A 504 and metal B 503) meet may experience the Seebeck effect at the junction points when there is a temperature difference between the metals and/or metal alloys (e.g., metal A 504 and metal B 503). The metals and/or metal alloys, metal A 504 and metal B 503, may be any type dissimilar metals and/or metal alloys. Many metal/metal alloy combinations may be used in the various embodiments. Any metal/metal alloy pairing and/or metal/metal alloy and semi-metal pairing that may form a thermocouple may be used in the various embodiments as metal A 504 and metal B 503 as long as the pairing produces a Seebeck voltage. In various embodiments, metal A 504 and metal B 503 may be high Seebeck coefficient alloys. For example, metal A 504 may be a metal alloy including nickel (Ni) (e.g., a Ni and chromium (Cr) alloy, a Ni, Cr, and another metal alloy, a Ni and Aluminum (Al) alloy, a Ni, Al, and Manganese (Mn) alloy, a Ni, Al, Mn, and Si alloy, etc.) and metal B 503 may be a metal alloy including copper (Cu) (e.g., a Cu and Ni alloy, a Cu, Ni, and another metal alloy, etc.). For example, metal A 504 may be Chromel (90% Ni-10% Cr) and metal B 503 may be Constantan (55% Cu-45% Ni). As other examples, metal A 504 or metal B 503 may be Alumel (95% Ni-2% Al-2% Mn-1% Si). Many combinations of metals and/or metal alloys are possible, but the highest voltage, about 60 µV/K, may come from a pairing of Chromel-Constantan. In the thermoelectric device 500, the hot end 501 and cold end 505 may be separated by the layer of metal A 504 and metal B arranged on a spacer 506. While FIG. 5 illustrates a single layer thermoelectric device 500, in various embodiments, multiple stacked layers of metal A 504 and metal B 503 with spacers 506 between the layers may be included in an embodiment thermoelectric device. The pairing of a portion of metal A 504 and metal B 503 including Seebeck junctions may be considered as an internal device generating power within the overall thermoelectric device 500. Just as additional layers may be added to a thermoelectric device, additional pairings of metals and/or metal alloys may be added in each layer as additional internal devices of the thermoelectric device. As such, any given embodiment thermoelectric device may have one or more layers and each of those layers may have one or more internal devices therein. The arrangement of multiple junctions between the dissimilar metals and/or metal alloys (metal A 504 and metal B 503) laterally in the same layer plane may create a lateral grid of metallic junction and the stacking of multiple layers of the dissimilar metals and/or metal alloys (metal A 504 and metal B 503) with spacers 506 between the layers of stacked metals and/or metal alloys (metal A 504 and metal B 503) may create a vertical grid. The lateral grid and vertical grid dimensions may define a 3D thermoelectric device. In various embodiments, the spacer 506 may be any high κ and low σ material. For example, the spacer may include Si, diamond, etc.

In the embodiment thermoelectric device 500, the number of junctions between metal A 504 and metal B 503, as well as the dimensions of the metals, metal A 504 and metal B 503, and the dimension of the spacer 506 may be variables that impact the efficiency of the embodiment thermoelectric device 500.

Metal post height (or junction height "JH") impacts the temperature gradient between junctions, and thus power output, as well as the thermal resistance. For example, longer junction heights JH increases the temperature gradient between junctions and thus increases power output, but longer junction heights JH also increase the thermal resistance, decreasing power output. Crossbeam height "CH" and crossbeam width "CW" may be adjusted, and thicker crossbeams allow for easier current flow (resulting in more power), but increase thermal resistance (resulting in less power). In various embodiments, the CH may be the same for both metal A 504 and metal B 503. In various embodiments, the CW may be the same for both metal A 504 and metal B 503. Increasing junction density in the same size thermoelectric device means more devices (e.g., metal junctions) within the thermoelectric device to generate power (more power), but the reduced device size (e.g., smaller junctions) lowers electrical and thermal conductivity (less power). More layers of metallic junctions increases the number of devices generating power within the thermoelectric device (more power), but also increases thermal resistance and flattens the temperature gradient (less power at each individual internal device). Additionally, spacer height "SH" may be a variable impacting the efficiency of the thermoelectric device. SH may be any height, such as a number of micrometers (µm), a number of nanometers (nm), etc. As specific examples, SH may be a number of micrometers (µm), such as above 10 µm, 10 µm, below 10 µm, 10 µm to 1 µm, 1 µm, less than 1 µm, etc. As other specific examples, SH may be a number of nanometers (nm), such as above 10 µnm, 10 µnm, below 10 µnm, 10 µnm to 1 µnm, 1 µnm or greater, 1 µnm, less than 1 µnm, etc.

FIGS. 6A-6E illustrate steps of an embodiment method for fabricating an embodiment metallic junction thermoelectric device. With reference to FIGS. 6A-6E, in step 600 (FIG. 6A), a spacer 506 may be provided. The spacer 506 may be a substrate, such as a Si wafer, diamond wafer, etc. The spacer 506 may be formed from any material, such as a high κ and low σ material. In step 601 (FIG. 6A), a first metal and/or metal alloy, such as metal A 504, may be fabricated on the spacer 506 along with an insulator 511. The metal A 504 may be configured into columns extending up from bases on the spacer 506. The columns may have a column length "CL" and the bases may have a base height "BH". CL and/or BH may be any heights, such as a number of micrometers (µm), a number of nanometers (nm), etc. As a specific example, the CL may be 9 µm and the BH may be 1 µm. When the metallic junction thermoelectric device is fully assembled, the CL may define the junction height (JH) and the BH may define the crossbeam height (CH) of the assembled metallic junction thermoelectric device. The fabrication in step 601 may be achieved according to any fabrication method including etching based methods and/or methods leveraging masks that permit deposition of material through (and/or around) the masks. As examples, the fabrication in step 601 may be achieved according the fabrication method described with reference to FIG. 1, the fabrication method described with reference to FIG. 2, etc.

In step 602 (FIG. 6B), a second metal and/or metal alloy, such as metal B 503, may be fabricated on the first metal and/or metal alloy, such as metal A 504, and insulator 511. The metal B 503 may be configured into bases above the metal A 504 and insulator 511 columns with columns extending down between gaps in the insulator 511 to contact the bases of metal A 504. The columns of metal B 503 may have a column length "CL" and the bases may have a base height "BH". CL and/or BH may be any heights, such as a number of micrometers (µm), a number of nanometers (nm), etc. As a specific example, the CL may be 9 µm and the BH may be 1 µm. When the metallic junction thermoelectric device is fully assembled, the CL may define the junction height (JH) and the BH may define the crossbeam height (CH) of the assembled metallic junction thermoelectric device. The CH of metal A 504 and metal B 503 may be the same in the assembled metallic junction thermoelectric device. The JH of the metal A 504 and metal B 503 may be the same in the assembled metallic junction thermoelectric device. As examples, the CH of metal A 504 and metal B 503 may be 9 µm or greater, 9 µm to 10 µm, 10 µm, 10 µm to 40 µm, 40 µm or greater, less than 1 µnm, 1 µnm, 1 µnm or greater, 1 µnm to 10 µnm, greater than 10 µnm, etc. The fabrication in step 602 may be achieved according to any fabrication method including etching based methods and/or methods leveraging masks that permit deposition of material through (and/or around) the masks. As examples, the fabrication in step 602 may be achieved according the fabrication method described with reference to FIG. 1, the fabrication method described with reference to FIG. 2, etc. In step 603 (FIG. 6B), a layer of spacer 506 may be deposited above the metal B 503 and insulator 511 forming a junction layer 610. While illustrated as only having two columns of metal A 504 and two columns of metal B 503 forming four metallic junctions in the junction layer 610 in FIGS. 6A-6E, the junction layer 610 may have any number of columns of metal A 504 and any number of columns of metal B 503 forming any number of metallic junctions in the same lateral plane. The arrangement of multiple junctions between the dissimilar metals and/or metal alloys (metal A 504 and metal B 503) laterally in the same layer plane may create a lateral grid of metallic junctions in the junction layer 610.

Figure 6A:
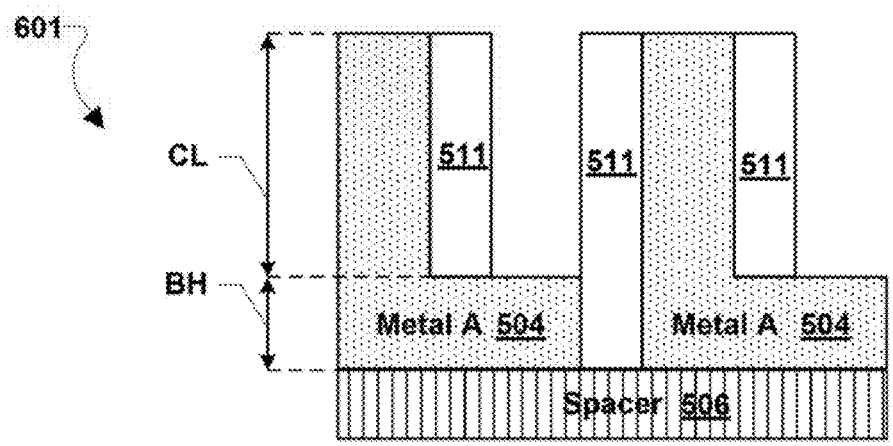
Figure 6C:
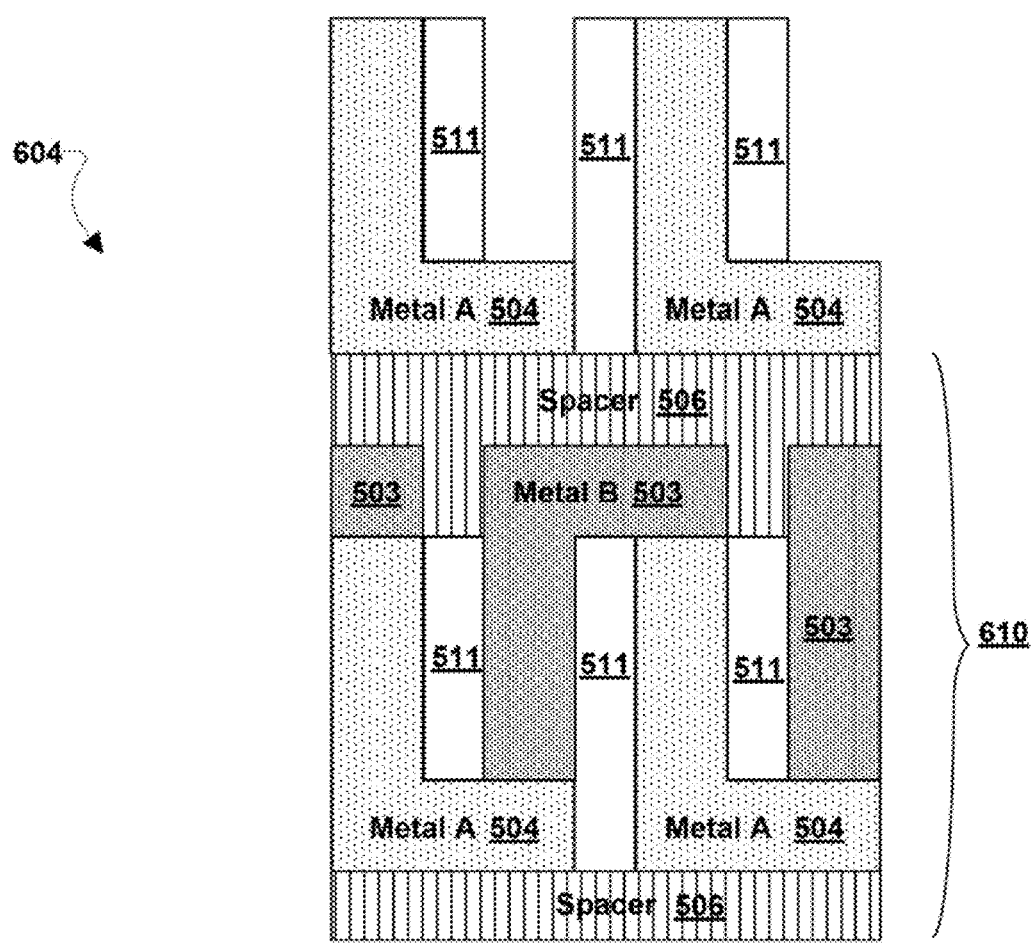
Figure 6D:
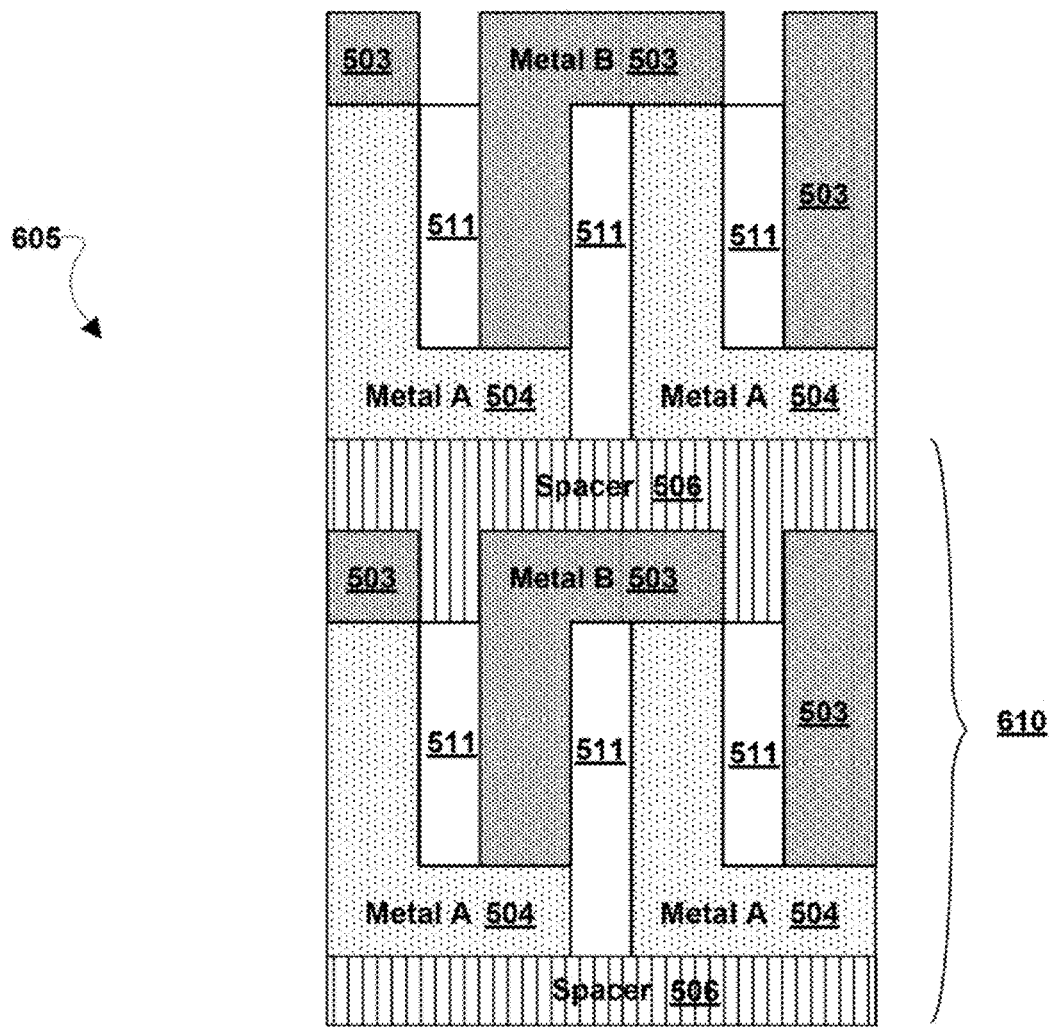
Figure 6E:
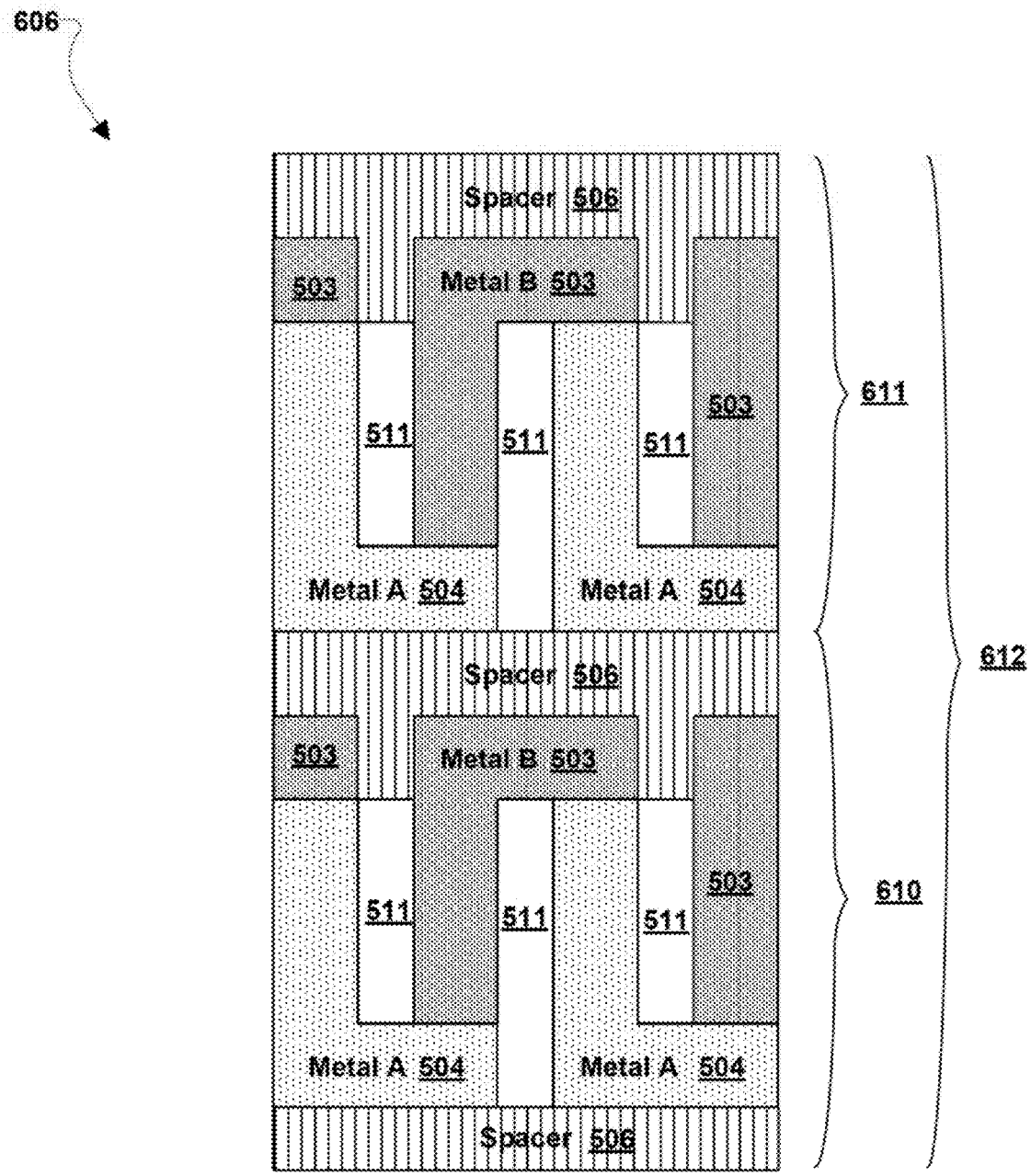

As discussed above, an embodiment thermoelectric device may include any number of junction layers. As such, the steps 601-603 may be e repeated to build up multiple junction layers in a thermoelectric device. For example, in step 604 (FIG. 6C), the operations of step 601 (FIG. 6A) as discussed above may be repeated to fabricate a first metal and/or metal alloy, such as metal A 504, may be fabricated on the spacer 506 along with an insulator 511. In step 605 (FIG. 6D), the operations of step 602 (FIG. 6B) as discussed above may be repeated to fabricate a second metal and/or metal alloy, such as metal B 503, on the first metal and/or metal alloy, such as metal A 504, and insulator 511. In step 606 (FIG. 6E), the operations of step 603 (FIG. 6B) as discussed above may be repeated to deposit a layer of spacer 506 above the metal B 503 and insulator 511 to thereby form a second junction layer 611. While illustrated as only having two columns of metal A 504 and two columns of metal B 503 forming four metallic junctions in the junction layer 611 in FIGS. 6C-6E, the junction layer 611 may have any number of columns of metal A 504 and any number of columns of metal B 503 forming any number of metallic junctions in the same lateral plane. The arrangement of multiple junctions between the dissimilar metals and/or metal alloys (metal A 504 and metal B 503) laterally in the same layer plane may create a lateral grid of metallic junctions in the junction layer 611. Together the first junction layer 610 and the second junction layer 611 formed thereon may form a two layer thermoelectric device 612. By repeating the operations of steps 601-603 additional layers may be built on the second junction layer 611. The arrangement of the lateral grid of metallic junctions in junctions layers 610 and 610 and the stacking of junction layers 610 and 610 may create a vertical grid in the thermoelectric device 612. While FIG. 6E illustrates the thermoelectric device 612 having two stacked junction layers, more than two junction layers may be stacked in various embodiments, such as three junction layers, three to five junction layers, five or more junction layers, five to eight junction layers, eight junction layers, and more than eight junction layers.

Figure 7:
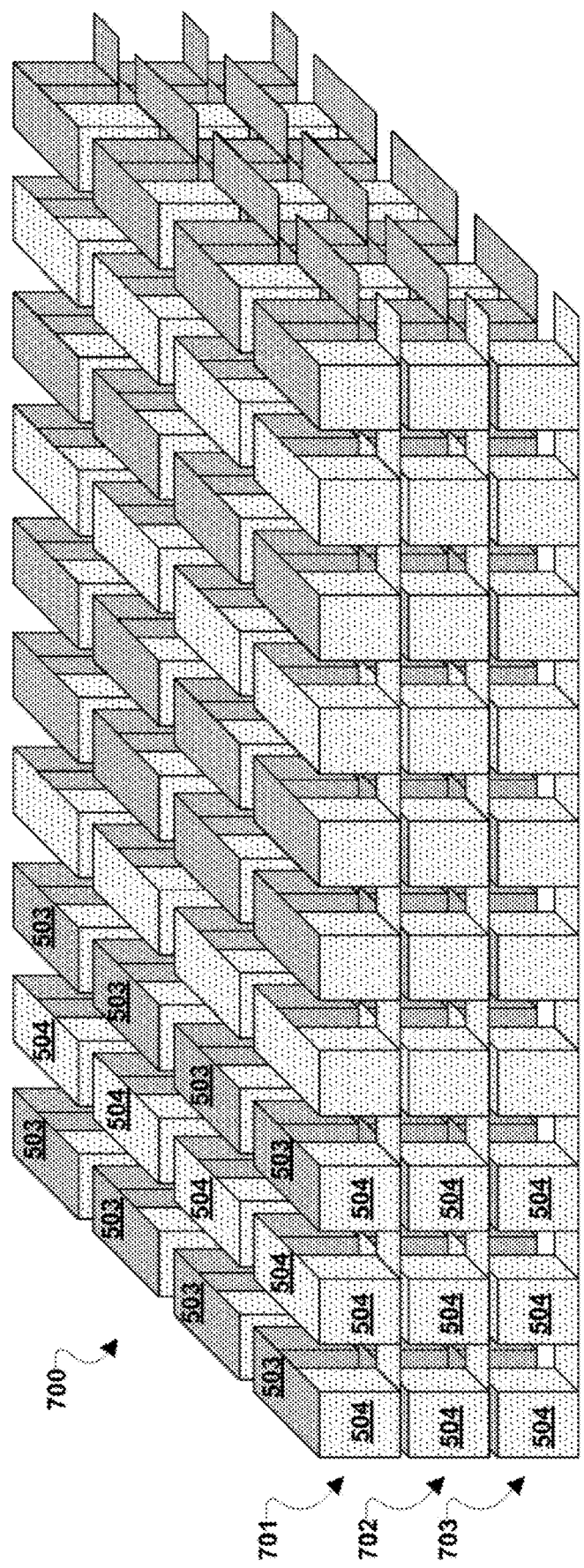
FIG. 7 is a block diagram of a portion of an embodiment metallic junction thermoelectric device.

FIG. 7 is a block diagram of a portion of an embodiment metallic junction thermoelectric device 700 that may be fabricated according to the operations of the method described with reference to FIGS. 6A-6E. The metallic junction thermoelectric device 700 may include three junction layers 701, 702, and 703. The junction layers 701, 702, and 703 may be wired in series or in parallel together in the metallic junction thermoelectric device 700. The arrangement of multiple junctions between the dissimilar metals and/or metal alloys (metal A 504 and metal B 503) laterally in the same layer planes of each respective junction layer 701, 702, and 703 may create a lateral grid of metallic junctions in each junction layer 701, 702, and 703. The stacking of multiple layers of the dissimilar metals and/or metal alloys (metal A 504 and metal B 503) in the junction layers 701, 702, and 703 may create a vertical grid. The lateral grid and vertical grid dimensions may vary in the various embodiments, and FIG. 7 illustrates one example of a three junction layer 701, 702, 703 device 700 example lateral grid and vertical grid dimensions.

While embodiment metallic junction thermoelectric devices are described above with reference to FIGS. 5, 6A-6E, and 7 including a first metal and/or metal alloy, such as metal A 504, and a second metal and/or metal alloy, such as metal B 503, in other embodiment thermoelectric devices, the first metal and/or metal alloy and/or the second metal and/or metal alloy may be substituted with other materials, such as semi-metallic compounds and/or semiconductors. Such semi-metallic compounds and/or semiconductors may be arranged in such alternative embodiment thermoelectric devices in the same manners as metal A 504 and/or metal B 503 in the metallic junction thermoelectric devices described with reference to FIGS. 5, 6A-6E, and 7, thereby substituting for metal A 504 and/or metal B 503 in the descriptions above. Accordingly, embodiment thermoelectric devices may be formed with a first material and a second material contacting each other at one or more junctions, where one or both of the first material and the second material are metals, metal alloys, semi-metallic compounds, and/or semiconductors.

Figure 8:
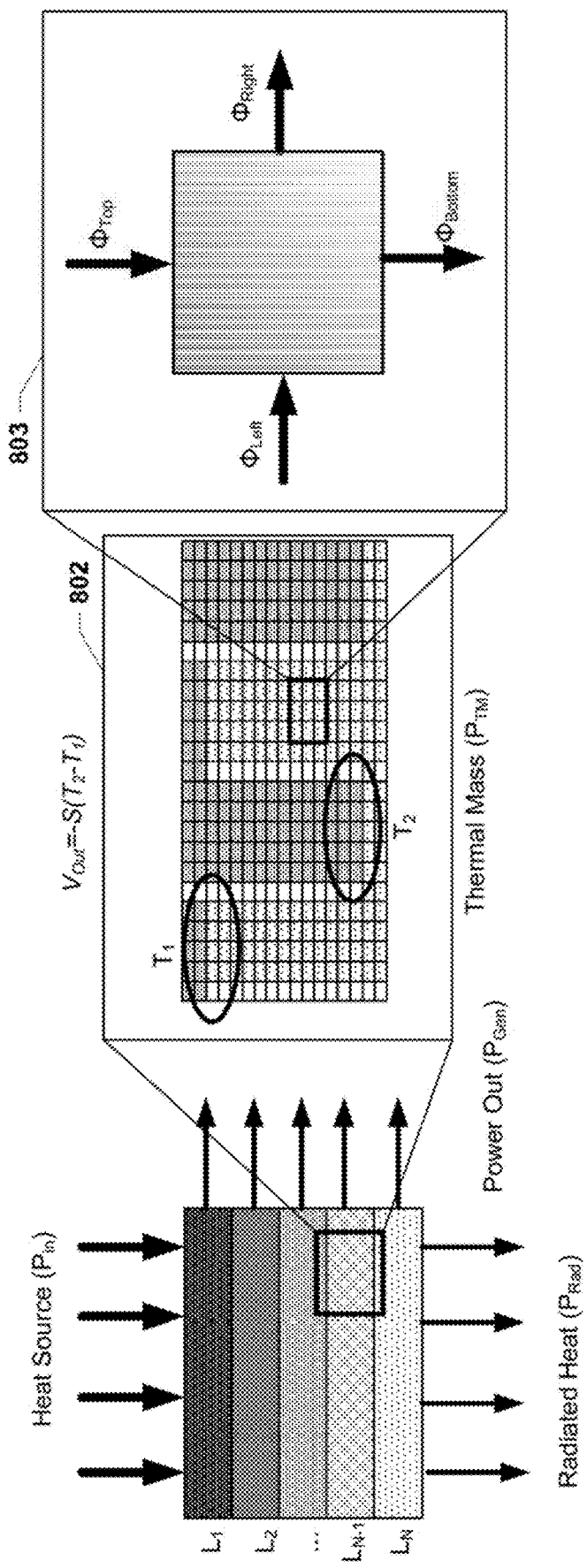
FIG. 8 is a graphical representation of finite element model simulation of an embodiment metallic junction thermoelectric device.

A finite element model (FEM) of an embodiment metallic junction thermoelectric device, such as the metallic junction thermoelectric devices illustrated in FIGS. 5, 6A-6E, and 7 was constructed in MATLAB. FIG. 8 is a graphical representation of FEM simulation.

The metallic junction thermoelectric device design was divided into a grid of rectangular areas, the finite elements, as shown in FIG. 8. Flux balance was tracked at each element, with the amount of heat entering and leaving from each of the four sides. Steady state heat flow was assumed at each edge for a time step small enough to approximate non-steady state heat flow. Also, a linear temperature gradient was assumed as the initial temperature profile from the heat source $T_{Hot}$ to the cold sink $T_{Ambient}$, greatly reducing the number of steps required for convergence. $T_{Hot}$ and $T_{Ambient}$ were assumed constant through the simulation, easing the processing burden. FIG. 8 shows the setup of the metallic junction thermoelectric device FEM with $L_1$-$L_N$ layers (i.e., junction layers). Each layer (i.e., junction layer) consists of several junctions (as the middle exploded portion 802 shows) separated into several discrete elements (as the far right exploded portion 803 shows). Each layer (i.e., junction layer) was represented as a single junction with looping boundary conditions; the thermal flux off the right side appears on the left edge, and vice versa. Constant temperature boundary conditions exist on the top of the top-most layer (i.e., top-most junction layer), where T was fixed at $T_{Hot}$, and likewise T was fixed at $T_{Ambient}$ for the bottom of the lowest layer (i.e., lowest junction layer).

Any net heat gain was calculated into a temperature increase according to the heat capacity and volume of the element, and likewise temperature losses for net heat losses. Resulting heat flux was then calculated. As such, the simulation was iterative, run for at least 100,000 iterations of alternating heat flux and temperature change calculations until convergence of temperature was obtained.

Figure 9:
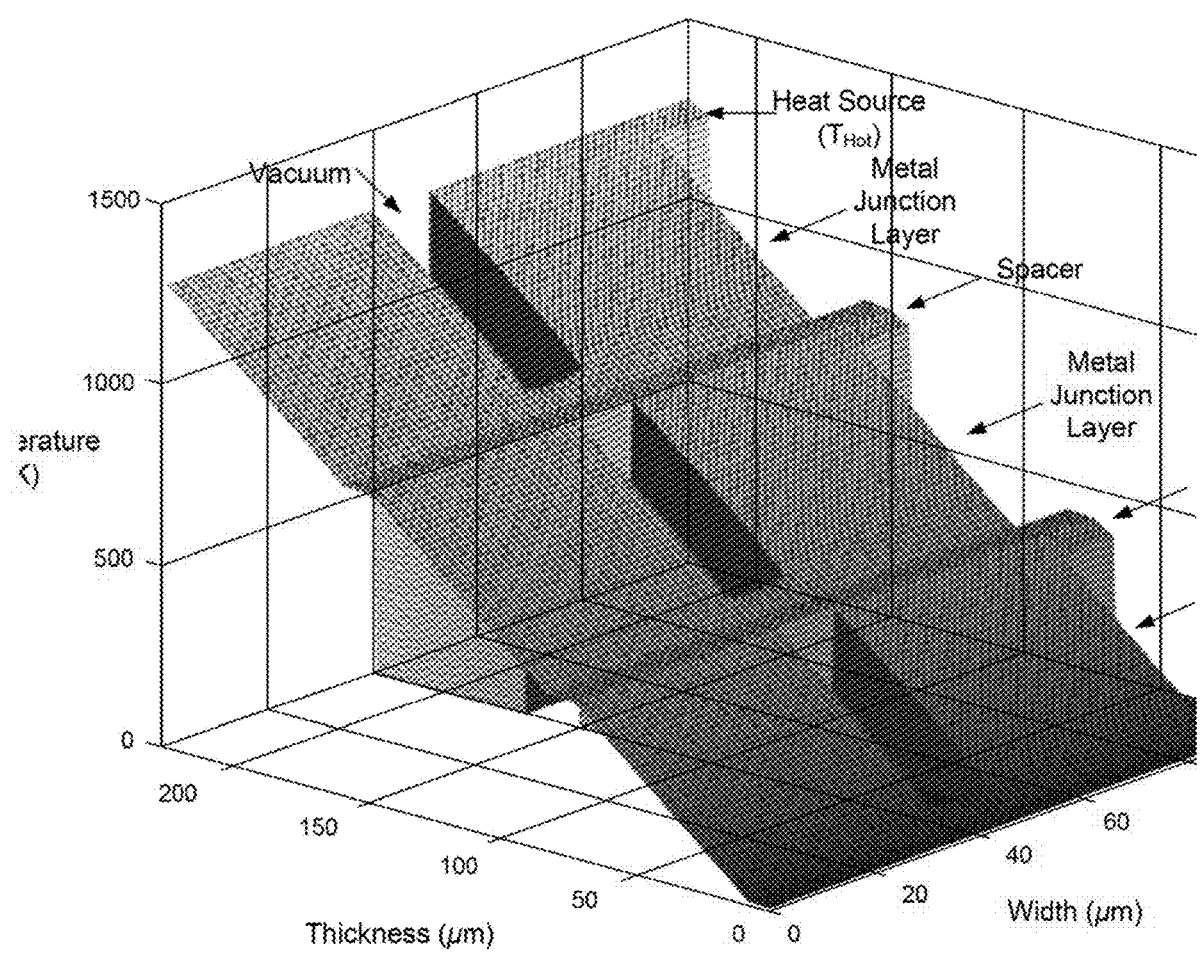
FIG. 9 is thermal profile graph at steady state of a modeled embodiment metallic junction thermoelectric device.

For a given device size and structure, several grid densities were simulated to obtain convergence on calculated efficiency. Lateral grid spacing is defined as the number of elements within a junction layer of the metallic junction thermoelectric device, while the vertical grid is the number of elements in the direction transverse to each junction layer. For most runs in the FEM simulation, individual devices were roughly 80 μm wide×70 μm tall, and the grid density was 50×75 in the lateral×vertical directions, corresponding to about 0.6 μm×1 μm for each element. More than this did not show improved accuracy in the results, while fewer did not speed up the simulation appreciably. A typical thermal profile of the metallic junction thermoelectric device after reaching equilibrium is shown in FIG. 9. The thermal profile in FIG. 9 is the profile of a three junction layer embodiment metallic junction thermoelectric device where $T_{Hot}$ is 1273K, $T_{Ambient}$ is 3K. The two metal alloys simulated were Chromel and Constantan and the spacer material was Si. Vacuum separated the columns for the two metal alloys from one another.

Figure 10:
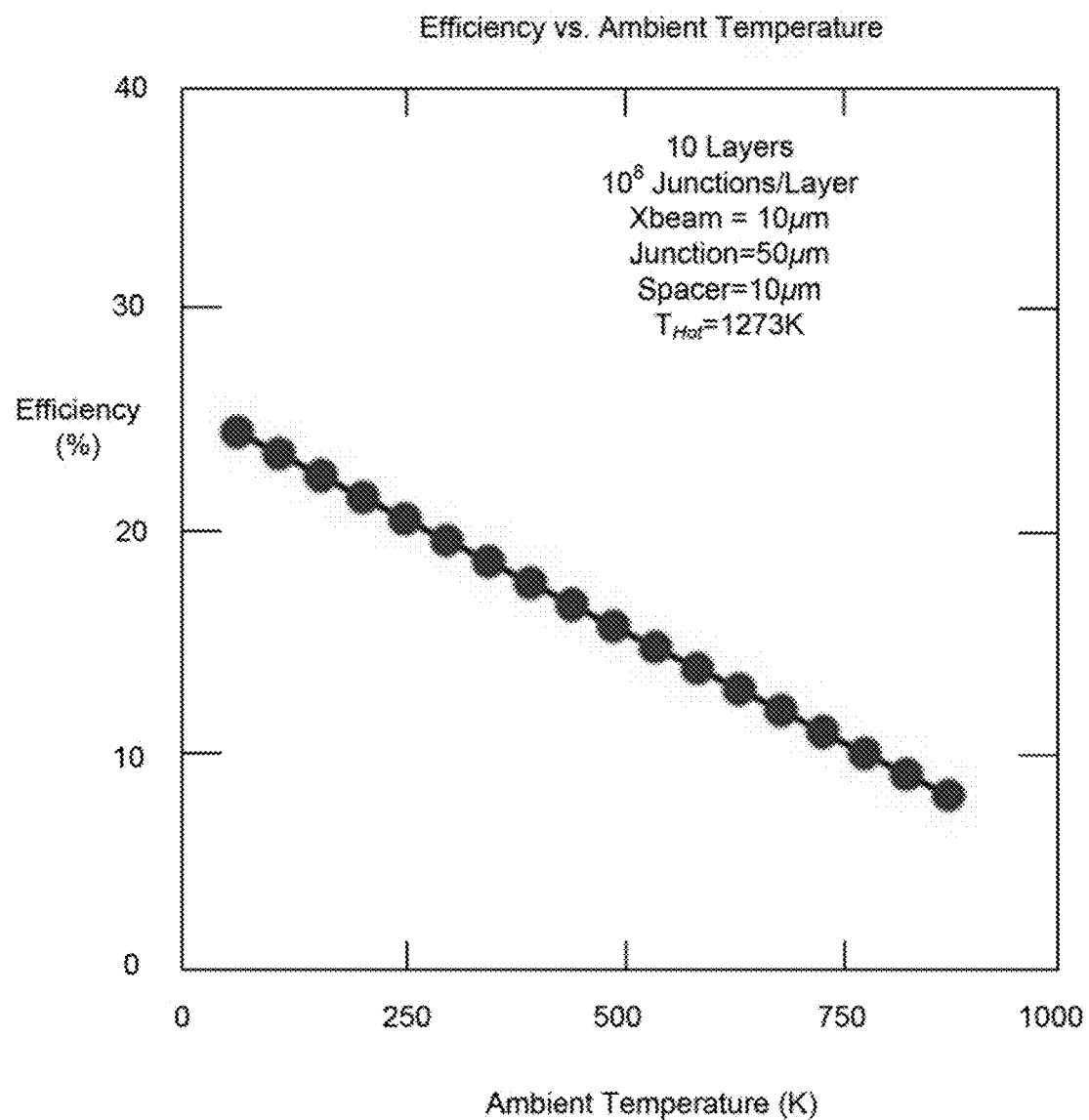
FIG. 10 is graph of efficiency versus ambient temperature of a modeled embodiment metallic junction thermoelectric device.

Optimization started with a "standard" device configuration of 10 layers (i.e., junction layers), $10^8$ devices per layer (i.e., junction layer), junction post height of 50 μm, and crossbeam heights of 10 μm. Starting with these wired in series, the efficiency as a function of $T_{Ambient}$ was calculated for a constant $T_{Hot}$=1273K and is plotted in FIG. 10. According to these results, the efficiency follows a linear trend, consistent with the linear temperature gradients that form in the metallic portions of the junctions. The space layers have a flatter temperature profile, consistent with Si having a much higher thermal conductivity and heat capacity than the constituent metals.

Figure 11:
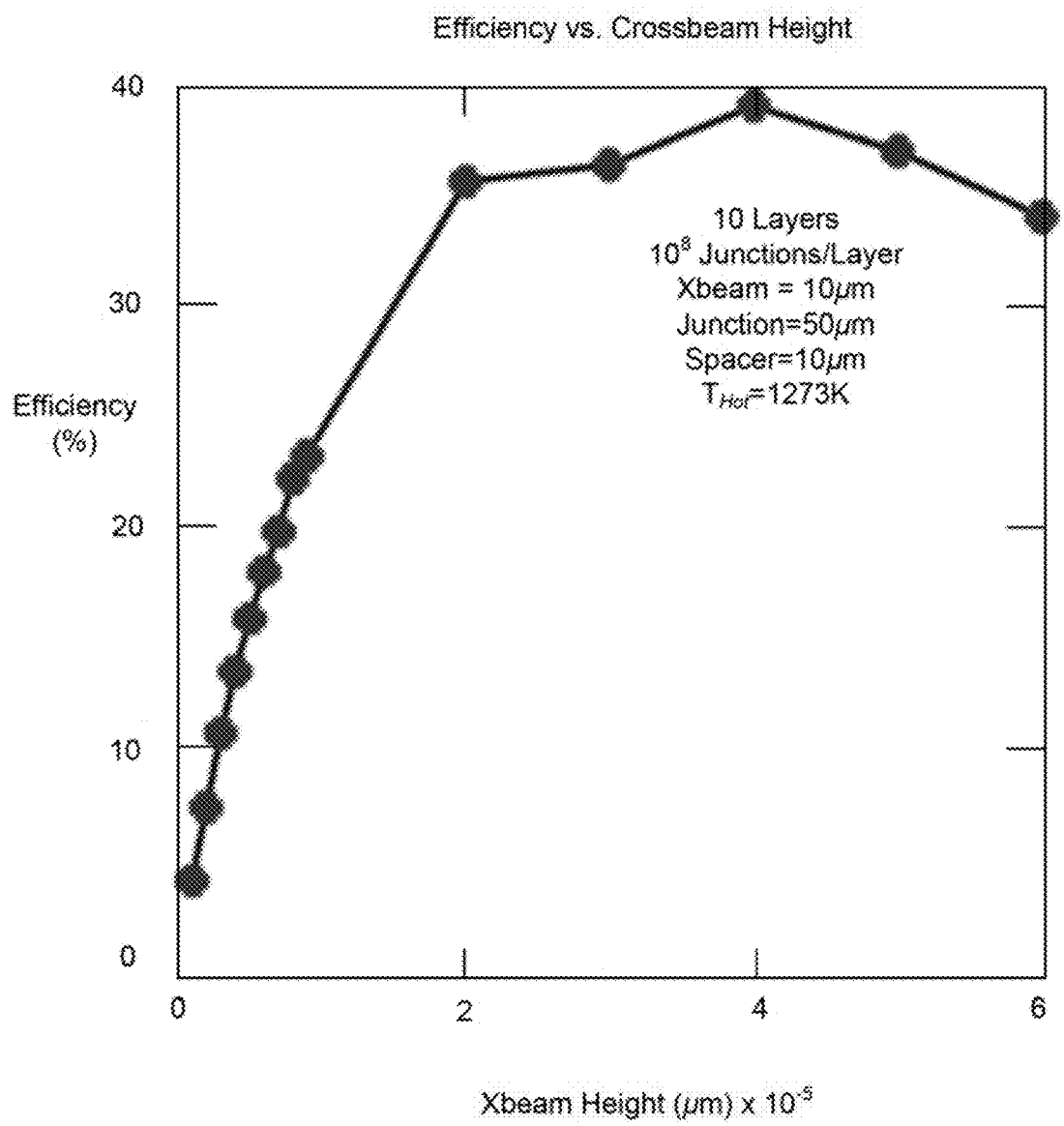
FIG. 11 is a graph of efficiency versus crossbeam height of a modeled embodiment metallic junction thermoelectric device.

Efficiency reaches a maximum of about 24% for these particular junction dimensions. Optimization of these dimensions began with the crossbeam height, plotted in FIG. 11. Efficiency increased from the starting height of 10 μm, then reached a maximum of 38% at a height of 40 μm, before dropping again with increasing crossbeam height. This is due to the competing factors listed above, namely, the larger height increases the amount of room for electron travel, decreasing electrical resistance, but also increasing the height for heat to pass through, increasing thermal resistance and thus restricting heat flow. The optimal balance for these two quantities is around 40 μm, for a junction post height of 50 μm and a spacer height of 10 μm. Changing these dimensions may affect the optimal crossbeam height, requiring re-optimization.

Figure 12:
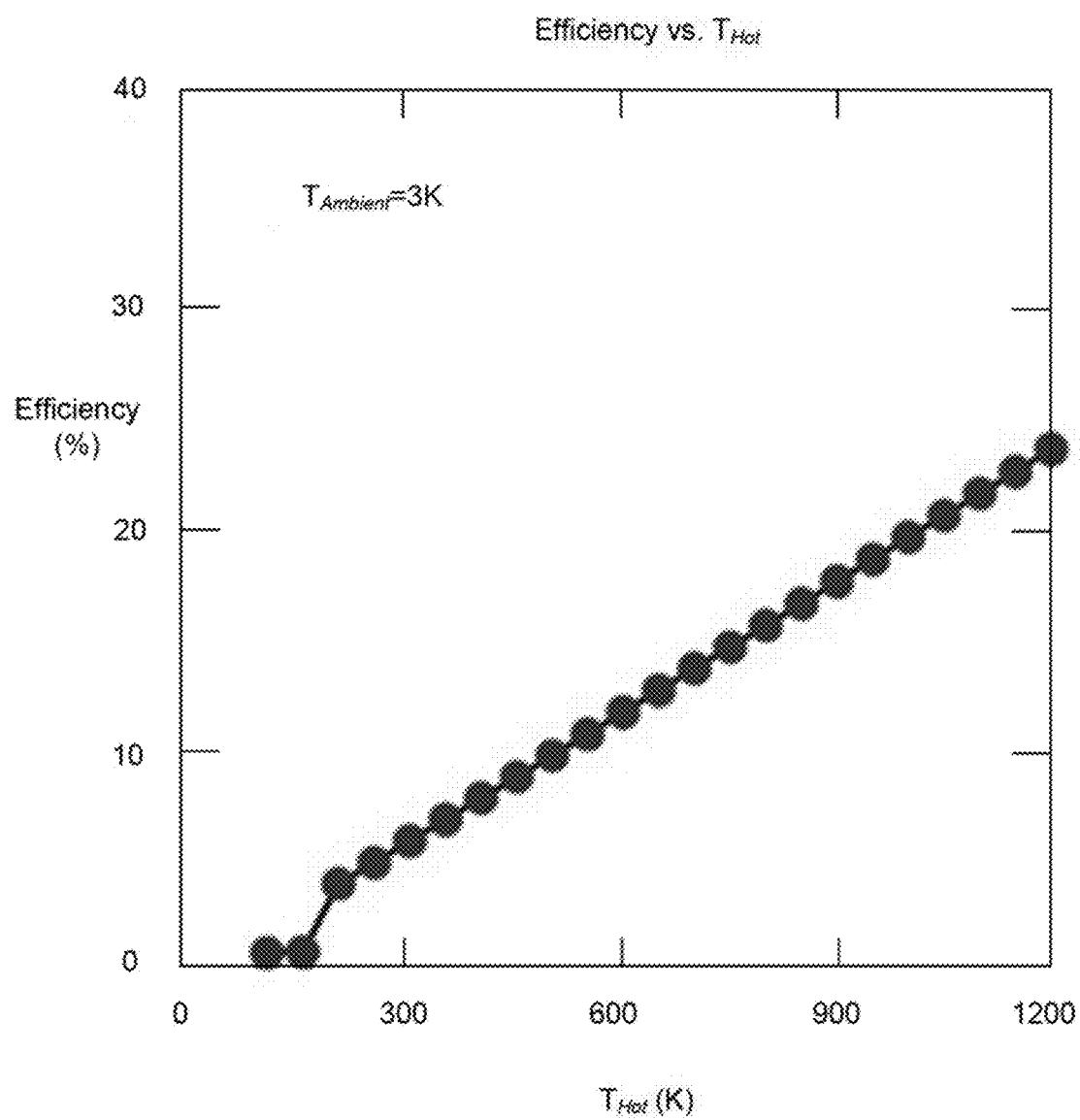
FIG. 12 is a graph of efficiency versus temperature of a modeled embodiment metallic junction thermoelectric device.

Efficiency versus $T_{Hot}$ is graphed in FIG. 12. Efficiency of the metallic junction thermoelectric device scales linearly with heat source temperature vs. a 3K background temperature. Similar results (not shown) are achieved with a 293K background temperature, albeit with lower efficiencies. These results show that, given the linear temperature gradient that exists within the device layers; as $T_{Hot}$ increases, the gradient becomes steeper, and thus the temperature difference between junctions causes an increased Seebeck effect.

Figure 13:
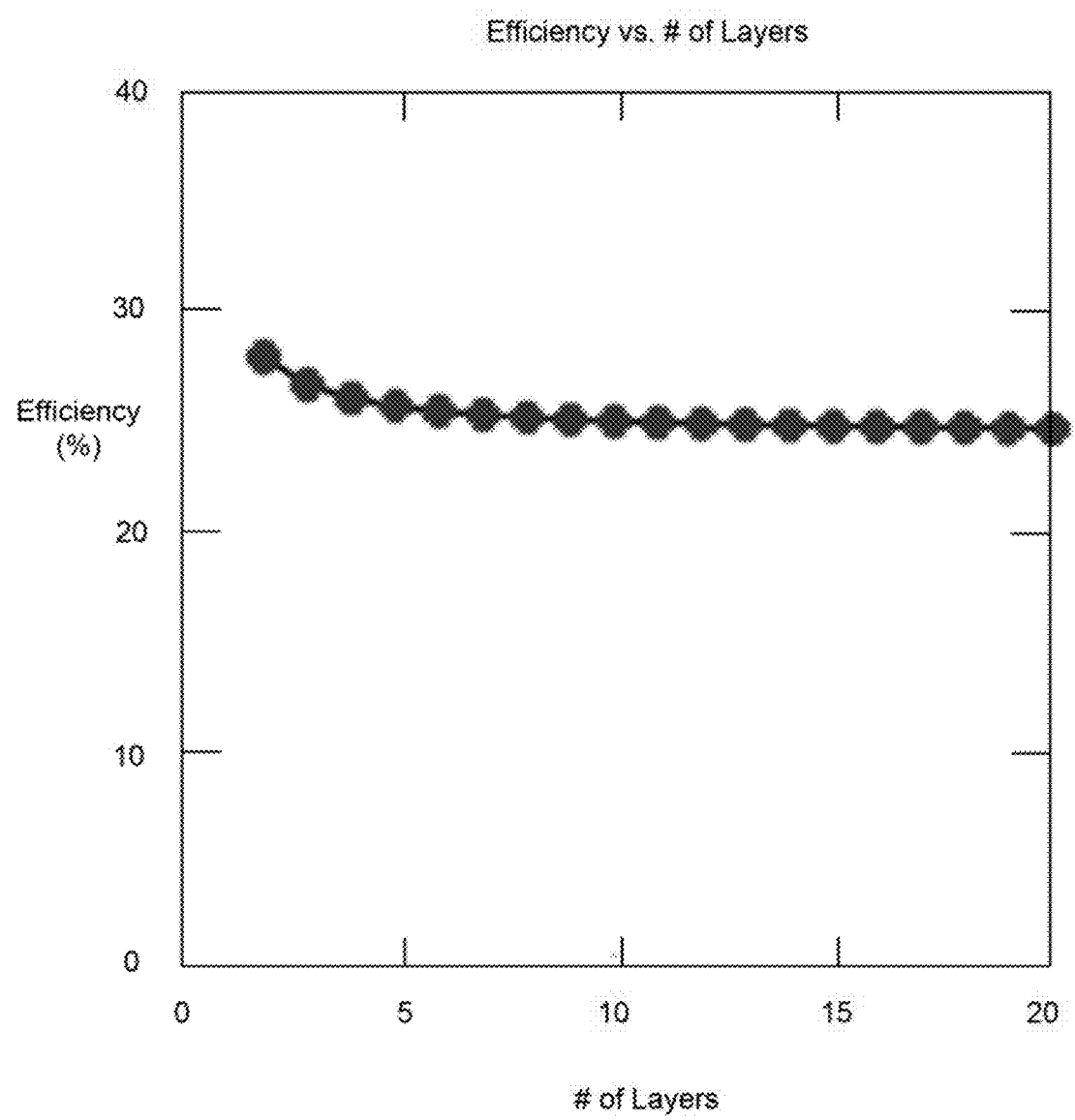
FIG. 13 is a graph of efficiency versus number of layers of a modeled embodiment metallic junction thermoelectric device.
Figure 14:
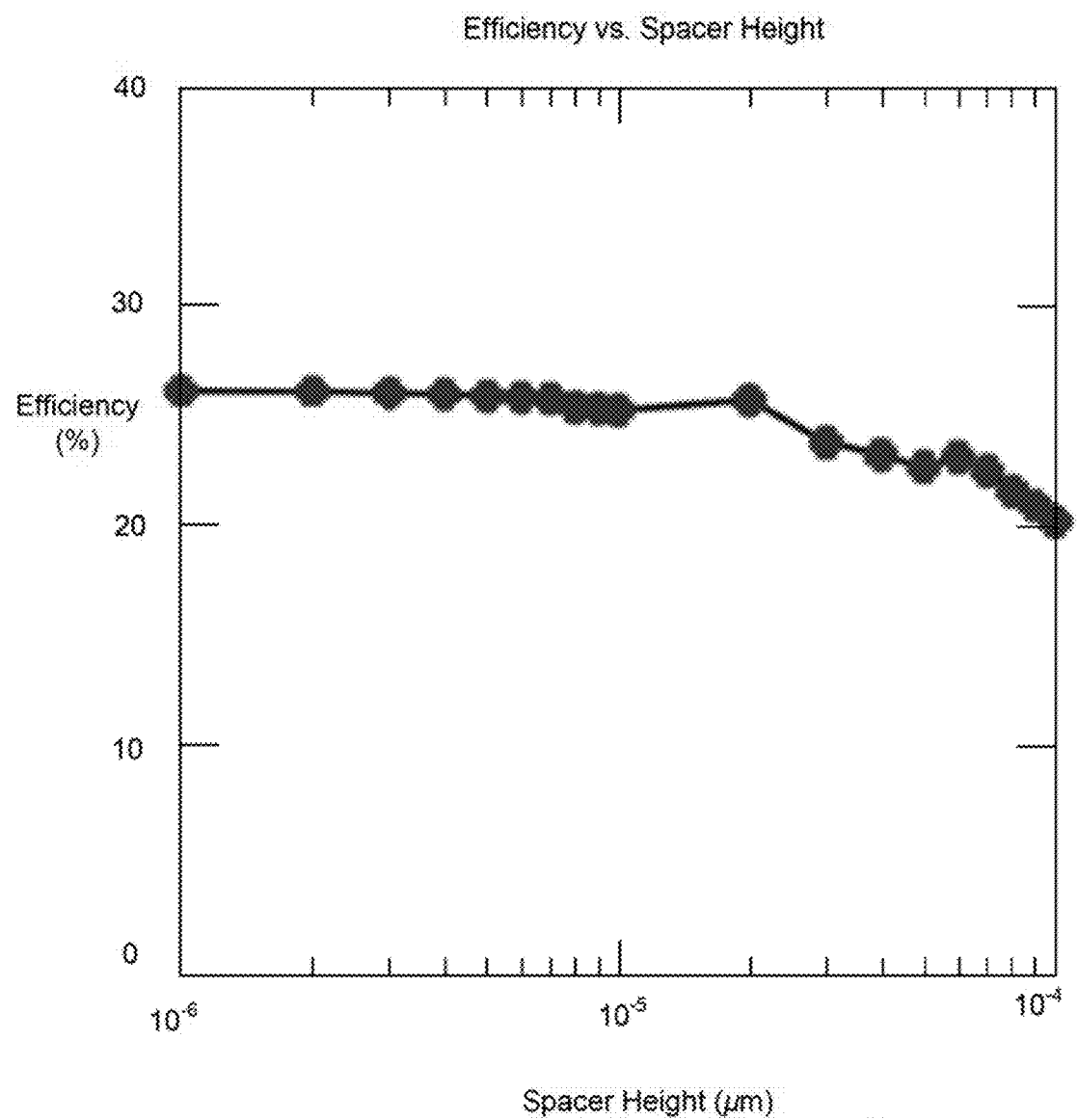
FIG. 14 is a graph of efficiency versus spacer height of a modeled embodiment metallic junction thermoelectric device.

Efficiency versus number of junction layers is plotted in FIG. 13. In constructing a metallic junction thermoelectric device, the number of junction layers increases the thermal and electrical resistance, but also harnesses more of the conducting heat. At about 8 junction layers, a consistent efficiency of ~25% is achieved, which does not appear to increase with more junction layers.

The 2 and 3 layer devices appear to be more efficient, but in reality may likely not maintain a $T_{Hot}$-$T_{Ambient}$ temperature gradient. The lowest layer (i.e., lowest junction layer) will heat up until the amount of radiation into ambient matches the heat flux into the lowest layer. That heating reduces the temperature gradient. Increasing the number of junction layers lowers the temperature gradient, spreading the temperature difference over an increasing height. This reduces the individual layer contributions to total output power, resulting in the same amount of total device output, but reduced for the increase in electrical resistance. As the number of junction layers increases, the thermal mass increases, allowing more power to be drawn out as electricity before reaching the radiator below the bottom layer.

Efficiency as a function of the spacer layer height is shown FIG. 15. For these simulations, undoped silicon was proposed as the spacer material; any thermally conductive and electrically insulative material (i.e., diamond) would work well here. Not surprisingly, FIG. 15 shows a decrease in efficiency as the height increases, owing to increased thermal resistance and the higher heat capacity of Si. These properties siphon energy away from the metallic junctions, reducing the gradient between them. This effect is rather small, not changing the efficiency much for any height below 10 μm. Above 10 μm, the impact is greater. For a practical device, parasitic capacitance and thermal strain in the spacer may also need to be considered.

Some efforts have been made to adapt conventional thermoelectric devices to human skin to harness power for low-power sensors and implants. These efforts produced at most 1 mW for large, bulky devices that were uncomfortable to wear and inconsistent in output due to changing ambient temperatures and clothing. The use of metallic junctions offers new possibilities to use thermoelectric devices on human skin to harness power for low-power sensors and implants. For wearable energy conversion fabric to be successful, the device needs to be flexible, yet sturdy. If the spacer layers between the metallic junction layers are sectioned to leave a gap between the junctions, flexibility is quite possible, and with only tens of layers at most, the total height should not exceed 1 mm. Encased in a thin, flexible shell for protection and durability, the packaged device could be adapted for any shape and area. As discussed above, as 38% efficiency is possible in various embodiments, a fivefold increase over current technology, making 5 mW of power possible by embodiment metallic junction thermoelectric devices, enough to power medical sensors, implants, and low-power wireless devices.

Vehicle engines and other heat sources provide another application area for embodiment metallic junction thermoelectric devices. Most engine heat is wasted as exhaust, while some of the usable work output powers a radiator to keep the engine from overheating. Leveraging the high engine heat with the forced cooling gives a high $T_{Hot}$ and a lower $T_{Ambient}$. Hence, efficiencies of 10-20% are quite possible, supplying electrical power for continuing combustion (in place of a battery) and to various onboard devices.

Deep space probes may benefit the most from embodiment metallic junction thermoelectric devices, thanks to the high difference between $T_{Hot}$ (1273K) and $T_{Ambient}$ (3K). $Pu^{238}$ is the isotope of choice in RTG construction as it has a high decay heat of ~1273K and primarily emits easily-contained alpha particles. However, stockpiles are tightly limited and difficult to produce as production requires a particle accelerator. Reducing the required amount to only about ⅕ the usual amount using the embodiment metallic junction thermoelectric devices alleviates this tremendously. Missions that require more power would be possible using the embodiment metallic junction thermoelectric devices, and this increases the feasibility of long-term manned missions into the solar system.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method for fabricating a device, comprising:
   providing a surface on which a metal or metal alloy is to be deposited;

suspending a first mask having a first hole pattern above the surface and between the surface and an outlet of a deposition system;

depositing a first amount of the metal or metal alloy from the outlet of the deposition system through holes in the first mask on to the surface;

removing the first mask;

suspending a second mask having a second hole pattern above the surface and between the surface and the outlet of the deposition system; and depositing a second amount of the metal or metal alloy from the outlet of the deposition system through holes in the second mask on to the surface, wherein the second hole pattern is different than the first hole pattern;

removing the second mask;

suspending a third mask having a third hole pattern above the surface and between the surface and the outlet of the deposition system; and depositing an insulator from the outlet of the deposition system through holes in the third mask on to the surface, wherein the third hole pattern is different than the first hole pattern and the second hole pattern.

2. The method of claim 1, wherein the second mask is suspended above the surface at a different height than the first mask.

3. The method of claim 1, wherein the third mask is suspended above the surface at a different height than the first mask and the second mask.

4. The method of claim 3, wherein the device is a complementary metal-oxide-semiconductor.

5. The method of claim 1, wherein the first mask is suspended above the surface at a height of 40 μm or less.

6. A method for fabricating a device, comprising:

providing a surface on which a first metal or metal alloy is to be deposited;

suspending a first mask having a first hole pattern above the surface and between the surface and an outlet of a deposition system;

depositing a first amount of the first metal or metal alloy from the outlet of the deposition system through holes in the first mask on to the surface;

removing the first mask;

suspending a second mask having a second hole pattern above the surface and between the surface and the outlet of the deposition system;

depositing a second metal or metal alloy from the outlet of the deposition system through holes in the second mask on to the surface, wherein the second hole pattern is different than the first hole pattern;

removing the second mask;

suspending a third mask having a third hole pattern above the surface and between the surface and the outlet of the deposition system; and depositing an insulator from the outlet of the deposition system through holes in the third mask on to the surface, wherein the third hole pattern is different than the first hole pattern and the second hole pattern.

7. The method of claim 6, wherein the second mask is suspended above the surface at a different height than the first mask.

8. The method of claim 6, wherein the third mask is suspended above the surface at a different height than the first mask and the second mask.

9. The method of claim 6, wherein the first mask is suspended above the surface at a height of 40 μm or less.

10. The method of claim 6, wherein the first metal or metal alloy and the second metal or metal alloy are formed into one or more junction layers.

11. The method of claim 10, wherein the one or more junction layers are two or more junction layers.

12. The device of claim 11, wherein the two or more junction layers are eight junction layers.

13. The method of claim 10, wherein the metal or metal or alloy comprises an alloy of nickel and chromium and the second metal or metal alloy comprises an alloy of copper and nickel.

14. The method of claim 13, wherein a crossbeam height of the alloy of nickel and chromium and the alloy of copper and nickel is the same.

15. The method of claim 14, wherein the crossbeam height is 1 nm or greater.

16. The device of claim 14, wherein the crossbeam height is 9 μm or greater.

17. The method of claim 10, wherein the one or more junction layers are two or more junction layers and the junction layers are separated by layers of spacer material.

18. The method of claim 17, wherein the spacer material is both thermally conductive and electrically insulative.

19. The method of claim 18, wherein a height of the spacer material is 10 μm or less.

* * * * *